(12) United States Patent
Akutagawa

(10) Patent No.: US 11,342,892 B2
(45) Date of Patent: May 24, 2022

(54) AMPLIFIER AND SIGNAL PROCESSING CIRCUIT

(71) Applicant: SONY SEMICONDUCTOR SOLUTIONS CORPORATION, Kanagawa (JP)

(72) Inventor: Kazuki Akutagawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/956,410

(22) PCT Filed: Dec. 13, 2018

(86) PCT No.: PCT/JP2018/045818
§ 371 (c)(1),
(2) Date: Jun. 19, 2020

(87) PCT Pub. No.: WO2019/131162
PCT Pub. Date: Jul. 4, 2019

(65) Prior Publication Data
US 2021/0091729 A1    Mar. 25, 2021

(30) Foreign Application Priority Data
Dec. 27, 2017  (JP) .............................. JP2017-250652

(51) Int. Cl.
*H03G 3/00*    (2006.01)
*H03F 3/16*    (2006.01)
(Continued)

(52) U.S. Cl.
CPC ................ *H03F 3/16* (2013.01); *H03G 3/30* (2013.01); *H03K 5/01* (2013.01); *H03K 2005/00078* (2013.01); *H03K 2005/00286* (2013.01)

(58) Field of Classification Search
CPC .... H03F 3/16; H03F 2200/351; H03F 3/2173; H03G 3/30; H03K 5/01; H03K 2005/00078; H03K 2005/00286
(Continued)

(56) References Cited

U.S. PATENT DOCUMENTS 5,428,309 A     6/1995  Yamauchi et al.
6,255,880 B1 *  7/2001  Nguyen ............. H03K 5/00006
                                                          327/277
(Continued)

FOREIGN PATENT DOCUMENTS

CN    1251697 A    4/2000
CN    1376329 A    10/2002
(Continued)

OTHER PUBLICATIONS

International Search Report and Written Opinion of PCT Application No. PCT/JP2018/045818, dated Mar. 5, 2019, 16 pages of ISRWO.

*Primary Examiner* — Ryan Jager
(74) *Attorney, Agent, or Firm* — Chip Law Group

(57) ABSTRACT

The present technology relates to an amplifier and a signal processing circuit that can reduce deterioration of signal quality. A voltage-to-time converter (VTC) integrates error information included in an output pulse width modulation (PWM) signal that is a PWM signal to be output to an outside of a device, so as to convert the error information into error time information. A delay unit generates a plurality of delayed signals using an input PWM signal that is a PWM signal input from the outside of the device. A signal selection unit selects a delayed signal according to the error time information from the plurality of delayed signals and outputs the output PWM signal. The present disclosure can be applied to, for example, an audio player.

5 Claims, 23 Drawing Sheets

(51) Int. Cl.
*H03G 3/30* (2006.01)
*H03K 5/01* (2006.01)
*H03K 5/00* (2006.01)

(58) Field of Classification Search
USPC .......................................................... 330/278
See application file for complete search history.

(56) References Cited

U.S. PATENT DOCUMENTS

| | | | |
|---|---|---|---|
| 6,316,992 | B1 | 11/2001 | Miao et al. |
| 6,768,779 | B1 | 7/2004 | Nielsen |
| 9,740,235 | B1* | 8/2017 | Xiu .......................... G06F 1/12 |
| 10,211,818 | B2* | 2/2019 | Lee ......................... H03L 7/085 |
| 10,236,866 | B2* | 3/2019 | Costa ..................... H03K 3/017 |
| 10,333,571 | B1* | 6/2019 | Chang ..................... H04L 25/14 |
| 10,804,919 | B1* | 10/2020 | Cranford ............. H03M 1/0612 |
| 11,031,924 | B1* | 6/2021 | Cheng ................... H03K 3/038 |
| 2005/0030206 | A1* | 2/2005 | Li ........................ H03L 7/0812 |
| | | | 341/53 |
| 2005/0237093 | A1* | 10/2005 | Wilhite ................ H03L 7/0812 |
| | | | 327/158 |
| 2018/0013411 | A1* | 1/2018 | Lee ....................... H03D 13/003 |
| 2018/0205383 | A1* | 7/2018 | Nowshadi .......... H03K 5/00006 |
| 2021/0027818 | A1* | 1/2021 | Chen .................... G11C 11/4096 |
| 2021/0091729 | A1* | 3/2021 | Akutagawa ............... H03G 3/30 |
| 2021/0135681 | A1* | 5/2021 | Midha ...................... H03M 3/35 |
| 2021/0247797 | A1* | 8/2021 | Gu ............................. G06F 1/12 |
| 2021/0250030 | A1* | 8/2021 | Abuellil ................ H03L 7/0812 |
| 2021/0250031 | A1* | 8/2021 | Abuellil ................ H03L 7/0814 |

FOREIGN PATENT DOCUMENTS

| | | |
|---|---|---|
| CN | 103188186 A | 7/2013 |
| JP | 02-296410 A | 12/1990 |
| JP | 04-000910 A | 1/1992 |
| JP | 2001-298349 A | 10/2001 |
| JP | 2001-517393 A | 10/2001 |
| JP | 2003-506940 A | 2/2003 |
| JP | 2005-268850 A | 9/2005 |
| JP | 2009-060557 A | 3/2009 |
| JP | 2009-253951 A | 10/2009 |
| JP | 2013-135401 A | 7/2013 |
| KR | 10-2002-0085867 A | 11/2002 |
| KR | 10-0426422 B1 | 4/2004 |
| WO | 1998/044626 A2 | 10/1998 |
| WO | 2001/010012 A1 | 2/2001 |
| WO | 2016/194651 A1 | 12/2016 |

* cited by examiner

US 11,342,892 B2

AMPLIFIER AND SIGNAL PROCESSING CIRCUIT

CROSS REFERENCE TO RELATED APPLICATIONS

This application is a U.S. National Phase of International Patent Application No. PCT/JP2018/045818 filed on Dec. 13, 2018, which claims priority benefit of Japanese Patent Application No. JP 2017-250652 filed in the Japan Patent Office on Dec. 27, 2017. Each of the above-referenced applications is hereby incorporated herein by reference in its entirety.

TECHNICAL FIELD

The present technology relates to an amplifier and a signal processing circuit, and particularly relates to an amplifier and a signal processing circuit that are capable of reducing deterioration of signal quality.

BACKGROUND ART

There is known a class D amplifier that outputs a PWM signal, which is a pulse width modulated signal, so as to amplify power. Class D amplifiers are classified into feedback types and non-feedback types. A feedback type corrects an error in an output signal and, thus, is easy to reduce distortion and can obtain a desired output signal characteristic.

Patent Document 1 proposes an amplifier that adjusts an edge position of a PWM signal by integrating an output error by an integrator and adjusting a delay of an input signal by an error integration amount.

CITATION LIST

Patent Document

Patent Document 1: International Publication No. 2016/194651

SUMMARY OF THE INVENTION

Problems to be Solved by the Invention

However, in the proposal of Patent Document 1, since a delay amount is adjusted, the center position of a signal pulse may be different from the center position of a pulse of the input signal, depending on an error to be corrected.

Since the difference becomes a factor in deteriorating the signal quality, it is desired that the center position of a pulse of the PWM signal is at an equal interval in every pulse. In particular, in a case where the output error is generated by a signal level, a change in the center position of a pulse occurs due to the signal level, and the change in the center position of the pulse causes signal distortion.

The present technology has been made in view of such a situation, and can reduce deterioration of signal quality.

Solutions to Problems

An amplifier according to a first aspect of the present technology includes a voltage-to-time converter (VTC) that integrates error information included in an output pulse width modulation (PWM) signal that is a PWM signal to be output to an outside of a device, so as to convert the error information into error time information, a delay unit that generates a plurality of delayed signals using an input PWM signal that is a PWM signal input from the outside of the device, and a signal selection unit that selects a delayed signal according to the error time information from the plurality of delayed signals and outputs the output PWM signal.

In the first aspect of the present technology, error information included in an output PWM signal that is a PWM signal to be output to an outside of a device is integrated, so as to be converted into error time information. A plurality of delayed signals is generated using an input PWM signal that is a PWM signal input from the outside of the device, a delayed signal according to the error time information is selected from the plurality of delayed signals, and the output PWM signal is output.

An amplifier of a second aspect of the present technology includes a first feedback unit that feeds back an output pulse width modulation (PWM) signal that is a PWM signal to be output to an outside of a device, an integrator that integrates a difference error obtained by comparing an input PWM signal that is a PWM signal input from the outside of the device with the output PWM signal fed back, a comparator that has one or more threshold values so as to change a signal width of the output PWM signal according to the integrated difference error, a plurality of output units that outputs the output PWM signal, a delay unit that delays a signal output from the comparator so that the plurality of output units operates in a stepwise manner, and a second feedback unit that feeds a signal output from the comparator back to the integrator in a section during which a value of the signal output from the comparator and a value of the output PWM signal are different.

In the second aspect of the present technology, an output PWM signal that is a PWM signal to be output to an outside of a device is fed back, a difference error obtained by comparing an input PWM signal that is a PWM signal input from the outside of the device with the output PWM signal that has been fed back is integrated, a signal output from a comparator that has one or more threshold values so as to change a signal width of the output PWM signal according to the integrated difference error is delayed so that a plurality of output units that outputs the output PWM signal operates in a stepwise manner, and a signal output from the comparator is fed back to the integrator in a section during which a value of the signal output from the comparator and a value of the output PWM signal are different.

A signal processing circuit according to a third aspect of the present technology includes a resampling unit that increases a data rate of two or more one-bit oversampled data to two times or more, a phase shift unit that shifts a phase of the data in which the data rate is increased to two times or more, and an addition unit that adds the data whose phase has been shifted.

In the third aspect of the present technology, a data rate of two or more one-bit oversampled data is increased to two times or more, a phase of the data in which the data rate has been increased to two times or more is shifted, and the data whose phase has been shifted is added.

Effects of the Invention

According to the present technology, deterioration in signal quality can be reduced.

Note that the effects described herein are merely examples, and the effects of the present technology are not

MODE FOR CARRYING OUT THE INVENTION

Hereinafter, modes for carrying out the present disclosure (hereinafter referred to as embodiments) will be described. The description will be made in the following order.

1. First Embodiment (Class D Amplifier)
2. Second Embodiment (Class D Amplifier)
3. Third Embodiment (One-bit ΔΣ A/D Converter)

1. First Embodiment

Configuration Example of Class D Amplifier of Present Technology

Figure 1:
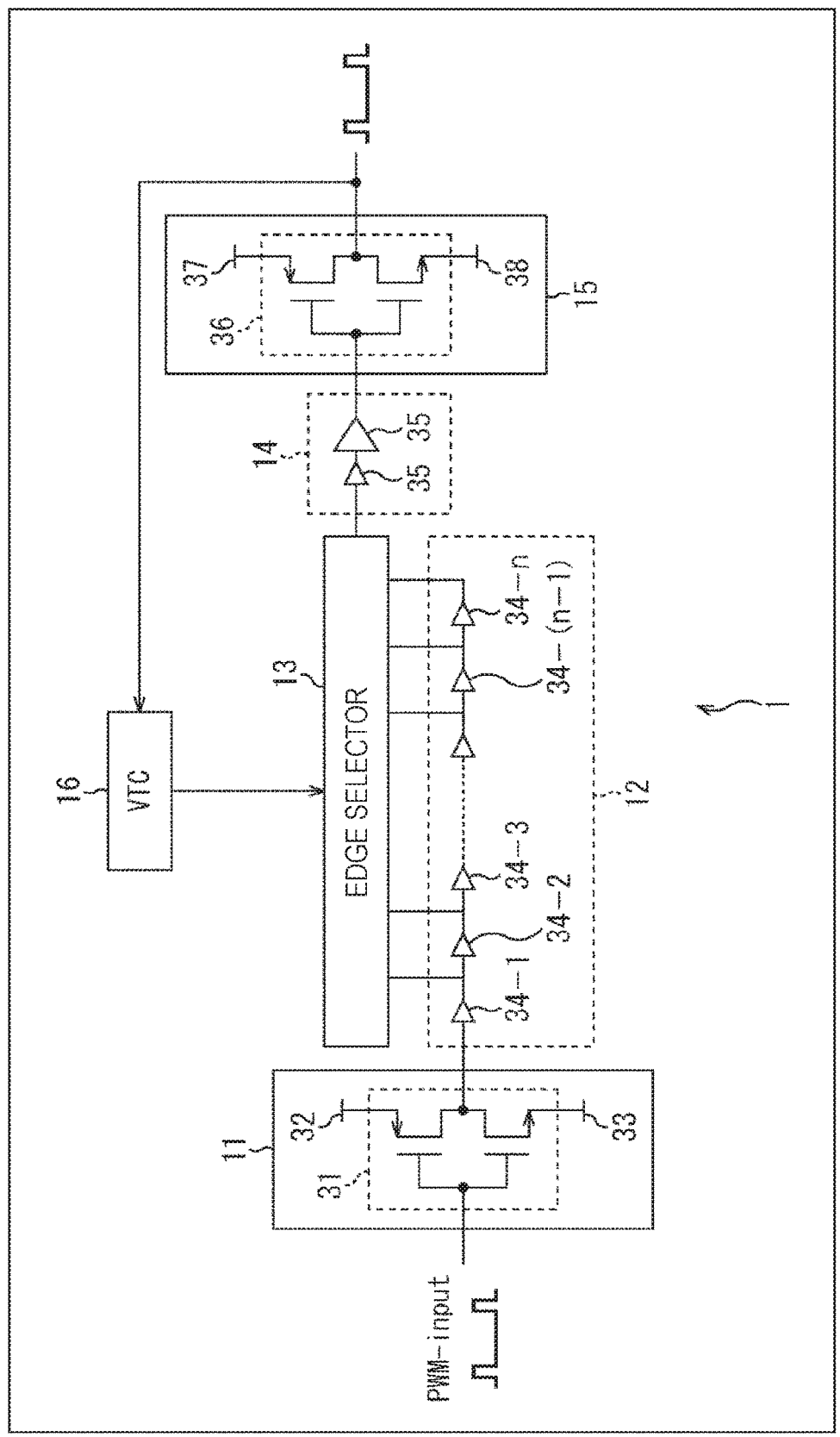
FIG. 1 is a circuit diagram illustrating a first configuration example of a class D amplifier to which the present technology is applied.

FIG. 1 is a circuit diagram illustrating a first configuration example of a class D amplifier to which the present technology is applied.

The class D amplifier 1 illustrated in FIG. 1 includes an input unit 11, a delay unit 12, an edge selector 13, a gate driver 14, an output unit 15, and a voltage-to-time converter (VTC) 16.

A pulse width modulation (PWM) signal that is a pulse width modulated signal is input to the class D amplifier 1. The class D amplifier 1 amplifies power of the PWM signal that has been input (input PWM signal) and outputs a PWM signal obtained as a result (output PWM signal).

The input unit 11 has a variable mechanism that changes a peak value of the input PWM signal so as to follow a peak value changed by the output unit 15. Here, the peak value represents a signal level (amplitude) of the PWM signal. The input unit 11 outputs the input PWM signal whose peak value has been changed to the delay unit 12.

The input unit 11 includes an inverter 31, a power supply circuit 32, and a power supply circuit 33.

The inverter 31 includes a PMOS transistor and an NMOS transistor. The power supply circuit 32 outputs, to the inverter 31, a positive-side power supply voltage which is a predetermined voltage value within a variable range. The power supply circuit 33 outputs, to the inverter 31, a negative-side power supply voltage which is a predetermined voltage value within the variable range. As the power supply circuit 32 and the power supply circuit 33, a voltage regulator (low dropout regulator) with a variable output voltage can be used.

The delay unit 12 generates a plurality of delayed signals from the input PWM signal. The delay unit 12 is configured such that n inverters 34-1 to 34-$n$ (n is an integer of 2 or more) are connected in series.

The edge selector 13 selects a delayed signal according to error time information supplied from the VTC 16 from the plurality of delayed signals generated by the delay unit 12, and outputs the selected delayed signal to the gate driver 14.

The gate driver 14 drives the output unit 15 using the delayed signal supplied from the edge selector 13. The gate driver 14 includes an even number of inverters 35.

The output unit 15 is a switch circuit driven under control of the gate driver 14. The output unit 15 has a variable mechanism that varies (adjusts) the peak value of the output PWM signal.

The output unit 15 includes an inverter 36, a power supply circuit 37, and a power supply circuit 38.

The inverter 36 includes a PMOS transistor and an NMOS transistor. The power supply circuit 37 outputs, to the inverter 36, the positive-side power supply voltage which is a predetermined voltage value within the variable range. The power supply circuit 38 outputs, to the inverter 36, the negative-side power supply voltage which is a predetermined voltage value within the variable range. Similarly to the power supply circuit 32 and the power supply circuit 33, the power supply circuit 37 and the power supply circuit 38 can use a voltage regulator with a variable output voltage.

Set values of the positive-side power supply voltage and the negative-side power supply voltage are determined, for example, from a device in which the class D amplifier 1 is incorporated (for example, an audio player 201 in FIG. 14) according to presence or absence of a silent state, a volume set value, or the like.

The output unit 15 outputs a signal supplied from the gate driver 14 as an output PWM signal obtained by amplifying the power of the input PWM signal. The output PWM signal that has been output from the output unit 15 is output to the outside of the device and also to the VTC 16.

The VTC 16 converts an error contained in the output PWM signal supplied from the output unit 15 into error time information by integrating the error, and outputs the error time information to the edge selector 13.

Operation Example of Error Correction

Figure 2:
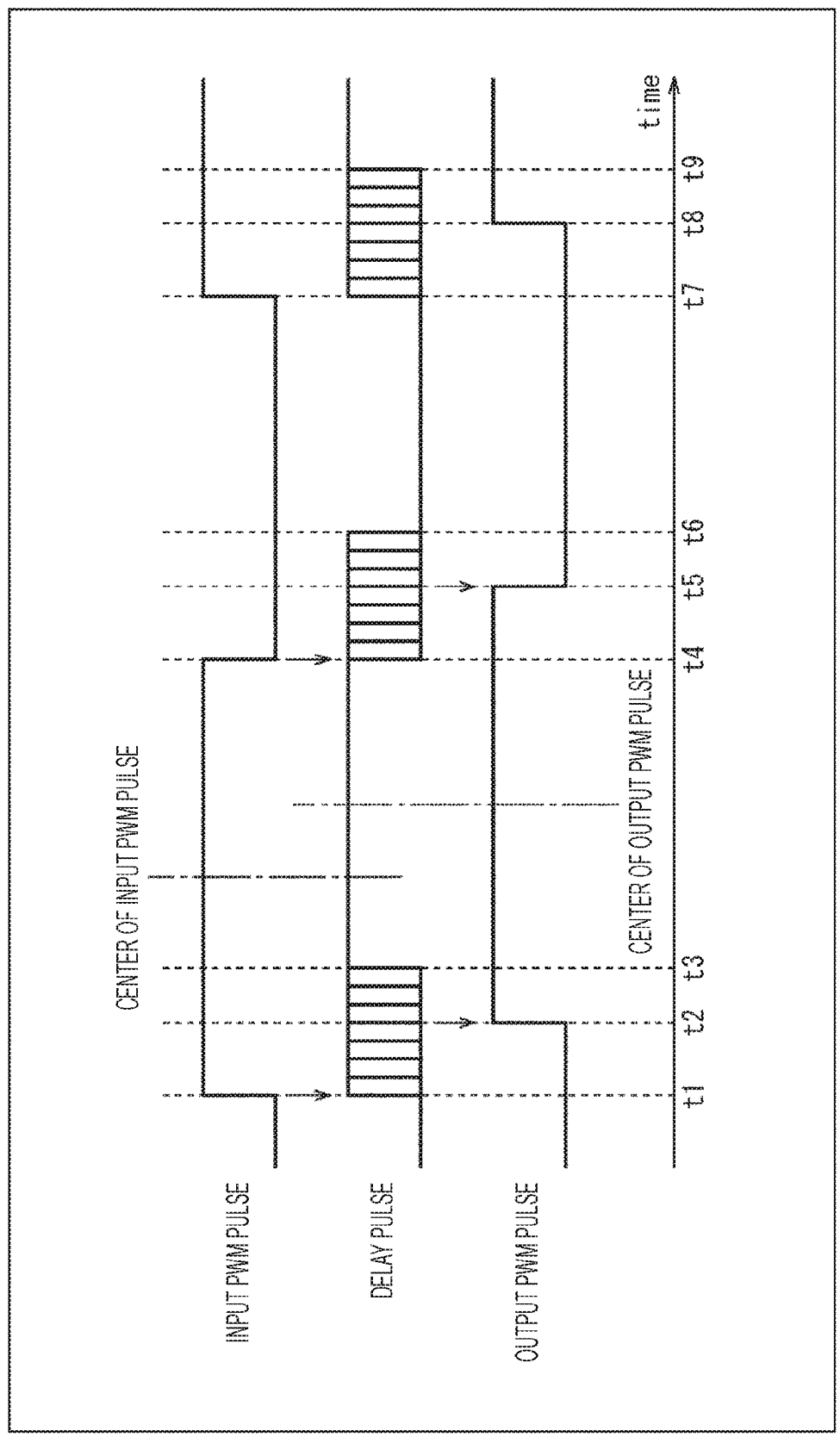
FIG. 2 is a diagram illustrating an operation of error correction.

FIG. 2 is a diagram illustrating an operation of error correction.

In the example of FIG. 2, an input PWM pulse waveform, a delay pulse waveform, and an output PMW pulse waveform are illustrated in the order from the top to the bottom. The input PWM pulse waveform is a waveform of the input PWM signal, and the delay pulse waveform is a waveform of the delayed signals. The output PMW pulse waveform is a waveform of the output PMW signal. FIG. 2 illustrates an example of a case where eight delayed signals are generated for the input PWM signal.

At time t1 when the input PWM signal becomes a high (H) state, generation of delayed signals is started. From time t1 to time t3, eight delayed signals are sequentially generated.

From time t4, at which the input PWM signal becomes a low (L) state, to time t6, the eight delayed signals sequentially become an L state.

In the edge selector 13 of FIG. 1, a delayed signal of an edge according to error time information obtained by converting an output error is selected from a plurality of edges of the delayed signals.

In FIG. 2, a rising edge of a pulse of the fifth delayed signal and a falling edge of the pulse of the fifth delayed signal are selected according to the error time information, and the fifth delayed signal is output as an output PWN signal.

Therefore, the position of a center of the pulse of the output PWM signal is basically maintained without being shifted.

Furthermore, the error time information generated in the VTC 16 can be held because it is handled as a digital value. Therefore, it is not necessary to immediately reflect an error of an integration result to the next output PWM signal as in a conventional case where the integration result by an integrator is used to select the delayed signal, and it is possible to select on which PWM signal a width adjustment by error is reflected.

Figure 3:
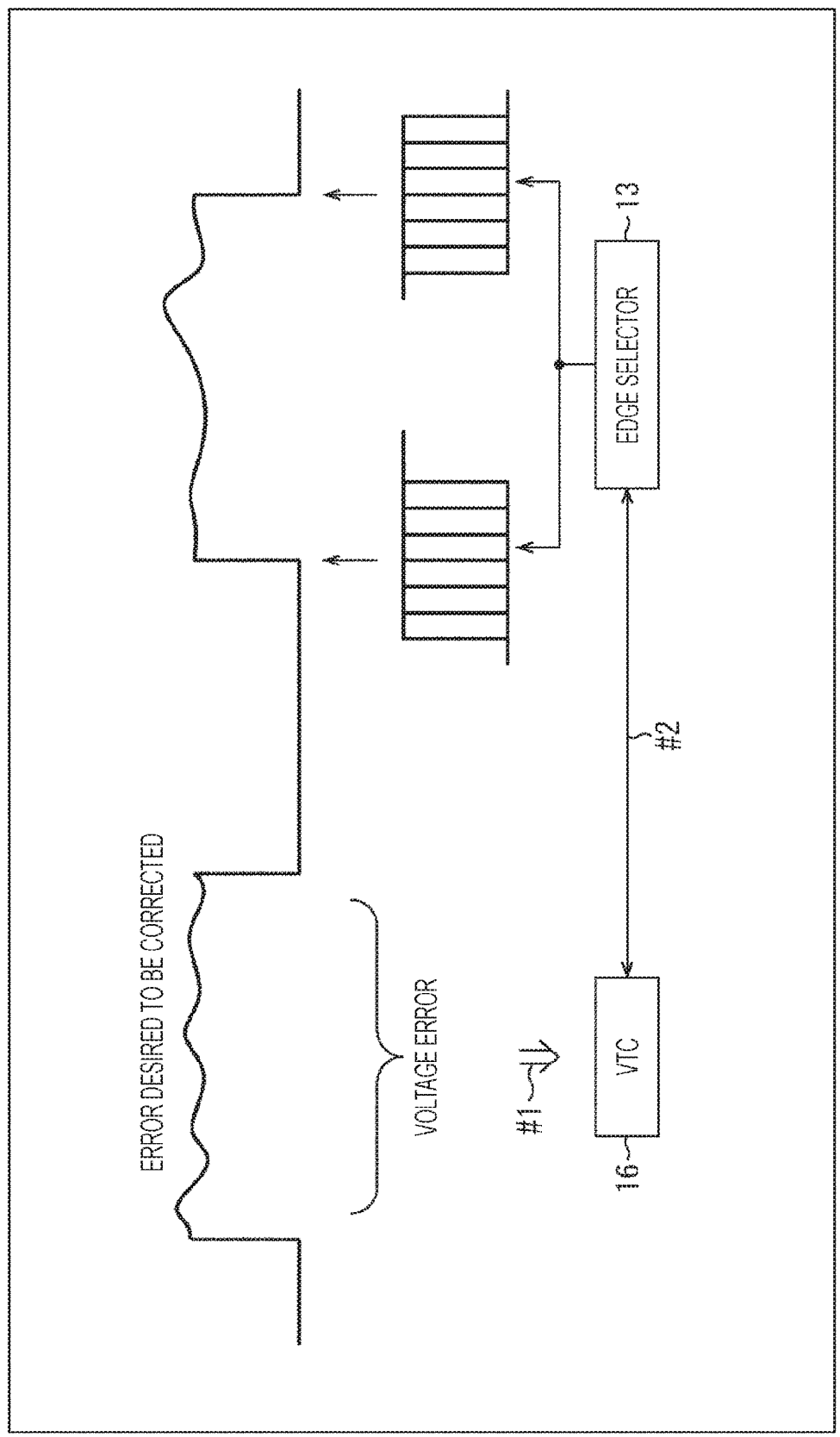
FIG. 3 is a diagram illustrating an example in which an error correction is reflected by delaying one pulse from an error output.

FIG. 3 is a diagram illustrating an example in which an error correction is reflected by delaying one pulse from a pulse from which an error is output.

As illustrated in an upper left part of FIG. 3, in a case where an error desired to be corrected is a voltage error, the VTC 16 integrates the voltage error included in the output PWM signal as indicated by arrow #1, thereby converting the voltage error into error time information.

The edge selector 13 can select a delayed signal corresponding to a fourth edge in seven delayed signals that are candidates, according to the error time information, targeting at an edge of a pulse next to the pulse used for detecting the voltage error as indicated by arrow #2.

Note that the number of candidates for the delayed signal may be set as an even number so that correction can be performed at both ends when a dimension of resolution is set. Furthermore, in a case where the number of candidates for the delayed signal is odd, the number may be divided by 0.5. In a case where the adjustment cannot be completed and an error remains, the remaining error may be corrected together with a correction to be corrected in the next pulse.

As described above, in the present technology, since an error included in an output signal is converted into error time information of a digital value, it is not necessary to immediately reflect the error, and an error correction can be reflected by delaying the pulse.

Thus, both edge positions of the PWM signal can be adjusted equally. By adjusting both the edge positions of the PWM signal equally, a change in center position of the PWM signal is suppressed. Thus, a center interval of the PWM signal is maintained, and deterioration of signal quality due to the change in center position can be suppressed.

Operation Example of Class D Amplifier

Figure 4:
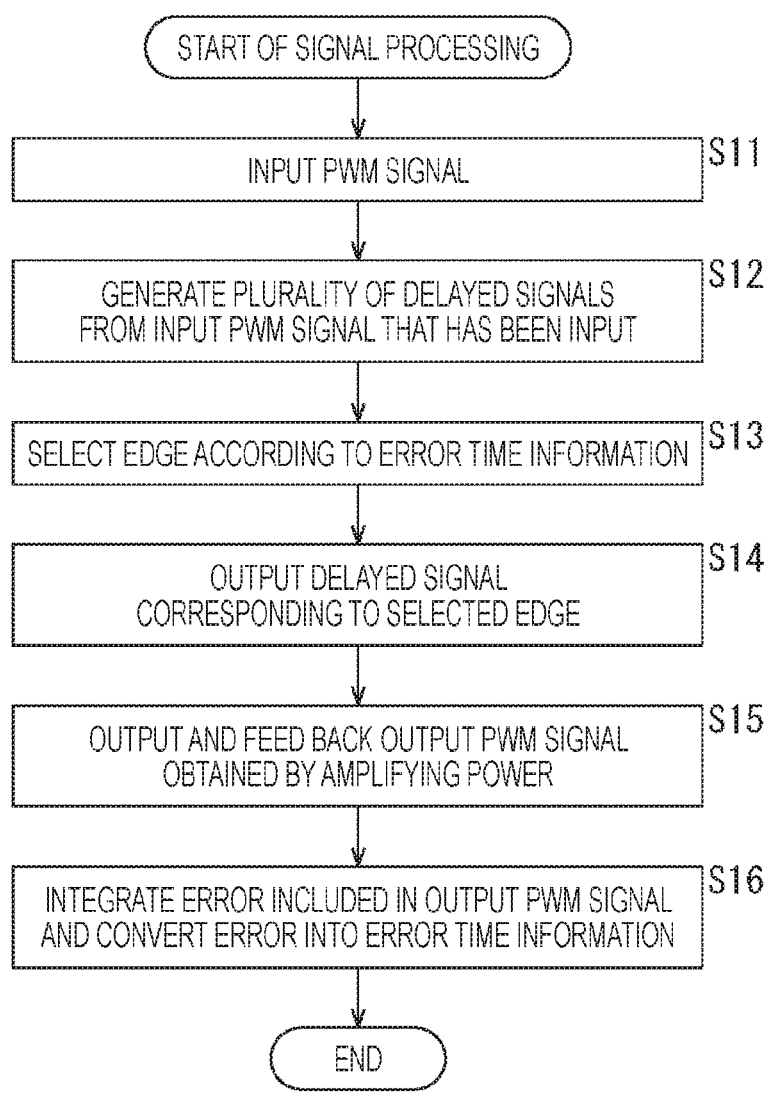
FIG. 4 is a flowchart illustrating signal processing of the class D amplifier in FIG. 1.

FIG. 4 is a flowchart illustrating signal processing of the class D amplifier 1 in FIG. 1.

In step S11, the input unit 11 inputs a PWM signal. The input PWM signal is output to the delay unit 12.

In step S12, the delay unit 12 generates a plurality of delayed signals from the input PWM signal.

In step S13, the edge selector 13 selects an edge according to error time information supplied from the VTC 16 from among edges of the plurality of delayed signals.

In step S14, the edge selector 13 outputs a delayed signal corresponding to the selected edge.

In step S15, under control of the gate driver 14, the output unit 15 outputs an output PWM signal obtained by amplifying power, and feeds the output PWM signal back to the VTC 16.

In step S16, the VTC 16 integrates an error included in the output PWM signal that has been fed back from the output unit 15 so as to convert the error into error time information. The converted error time information is output to the edge selector 13 and used for edge selection of the delayed signal.

As described above, in the present technology, the error included in the output PWM signal is integrated and converted into error time information, and a delayed signal according to the error time information is selected from among the plurality of delayed signals obtained by delaying the input PWM signal. Thus, both edge positions of the PWM signal can be adjusted equally.

Figure 5:
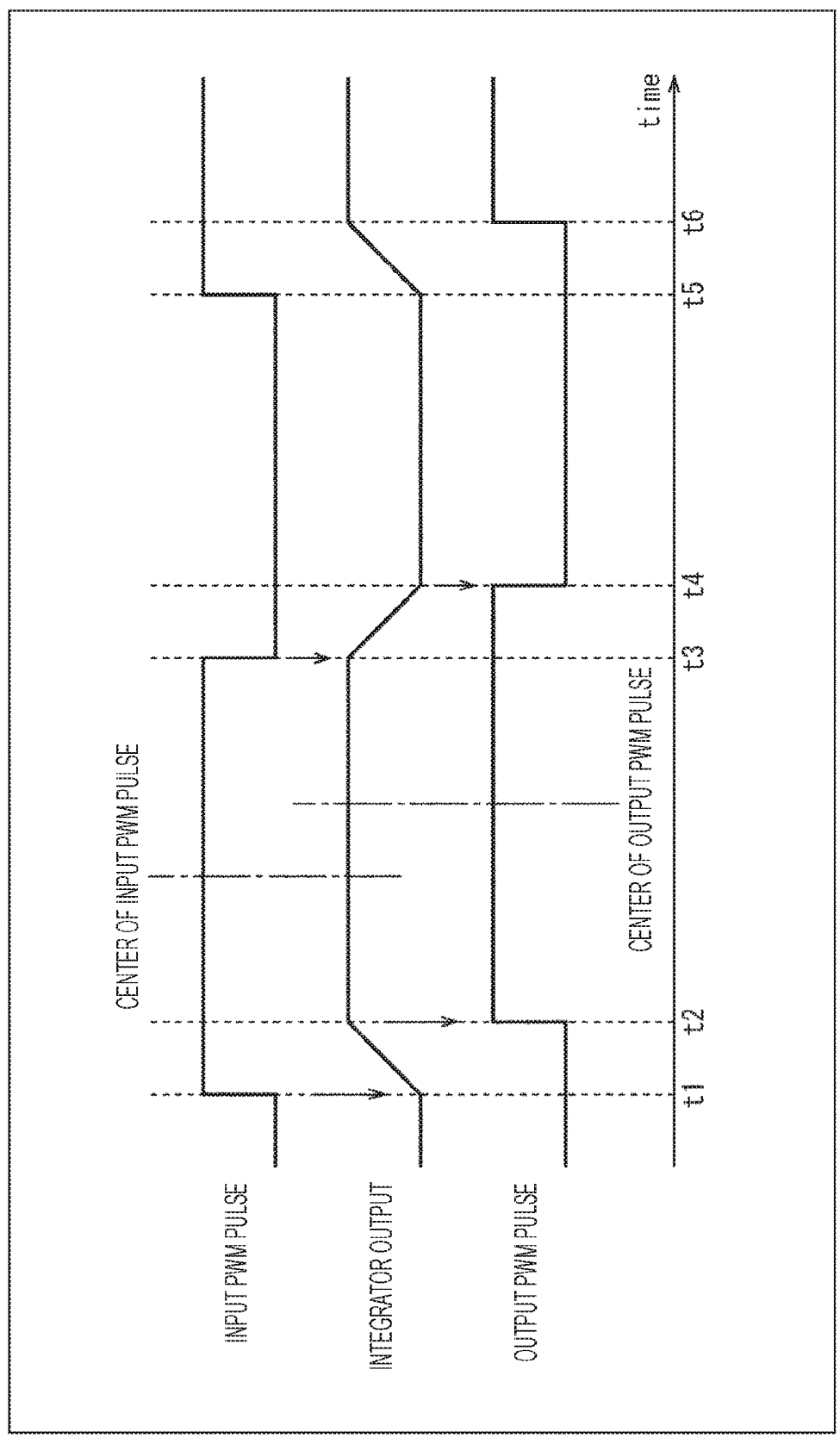
FIG. 5 is a diagram illustrating an operation example of a conventional error correction.

FIG. 5 is a diagram illustrating an operation example of a conventional error correction.

In the example of FIG. 5, an input PWM pulse waveform indicating a waveform of an input PWM signal, an integrator output waveform indicating a waveform of an integrator output, and an output PMW pulse waveform indicating a waveform of an output PMW signal are illustrated in the order from the top to the bottom.

The value of the integrator output increases from time t1 when the input PWM signal becomes an H state, and maintains the H state at time t2 when the output PWM signal becomes an H state. The value of the integrator output decreases from time t3 when the input PWM signal becomes an L state, and maintains L at time t4 when the output PWM signal becomes L.

In a conventional error correction, the output error is integrated by an integrator, and a delay amount of the input PWM signal is adjusted by an error integration amount, thereby adjusting the edge position after the PWM signal.

Since the delay amount is adjusted, at an edge, to an L state that is later in time, it has been possible that a center position of a pulse of the output PWM signal becomes different from a center position of a pulse of the input PWM signal depending on the error to be corrected.

On the other hand, in the present technology, since an integrator that is an analog element is not required, power needed by the output unit can be reduced. In the present technology, since an integrator is not required, it is not necessary to consider an effect caused by integral saturation.

In the above description, the delay unit 12 includes a plurality of inverters that are simple delay stages, but the delay unit 12 may include a general delay locked loop (DLL) or a phase locked loop (PLL).

Figure 6:
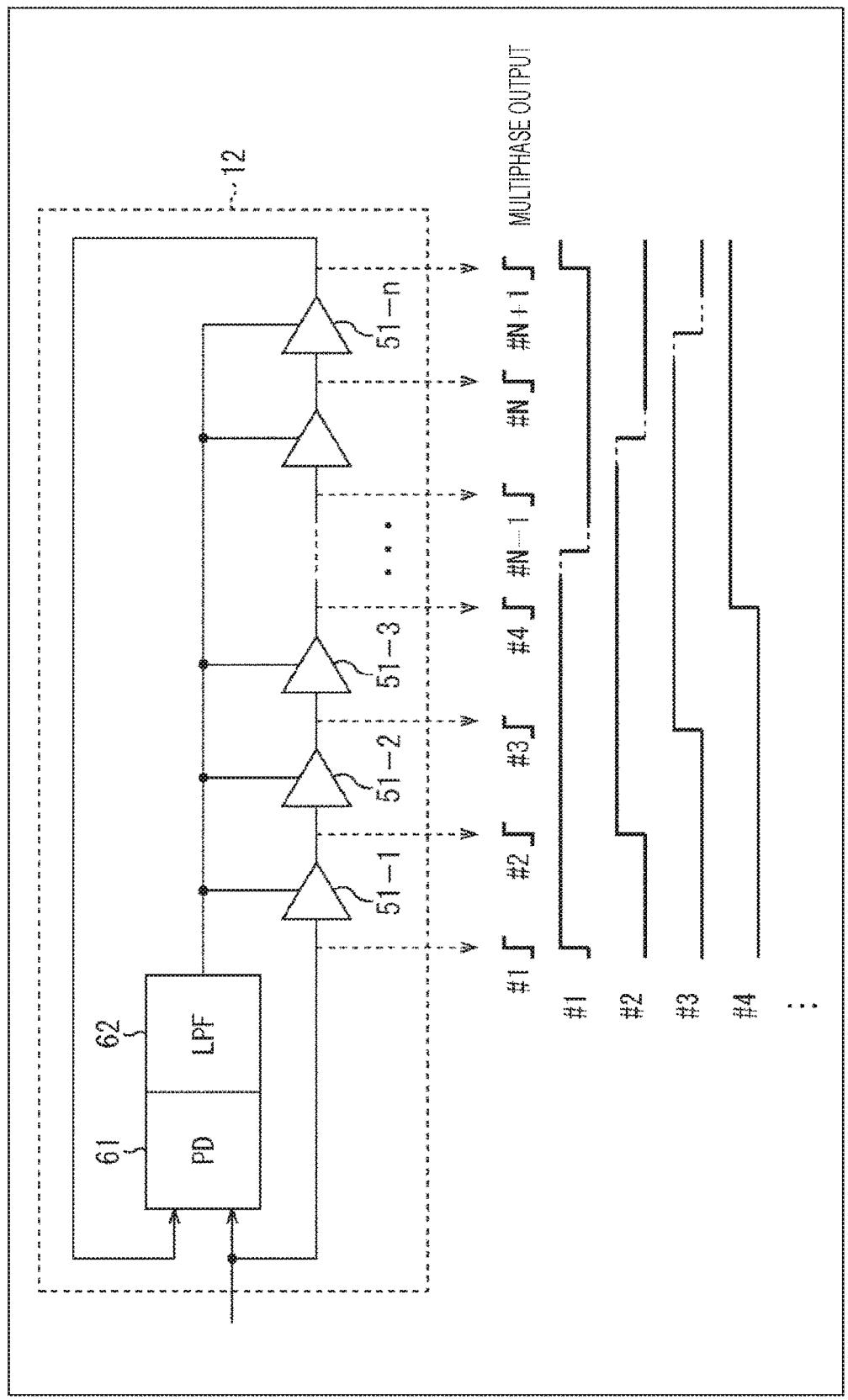
FIG. 6 is a circuit diagram illustrating an example of a case where a delay unit includes a delay locked loop (DLL).

FIG. 6 is a circuit diagram illustrating an example of a case where the delay unit 12 includes a DLL.

A configuration example of the delay unit 12 is illustrated in an upper part of FIG. 6. The delay unit 12 in FIG. 6 includes a phase detector 61, a low-pass filter 62, and inverters 51-1 to 51-*n*. A signal supplied from the input unit 11 is input to the inverter 51-1 and the phase detector 61 as an external input.

The phase detector 61 detects a phase difference between an external input and a DLL output supplied from the inverter 51-*n*, and outputs the detected phase difference signal to the LPF 62.

The LPF 62 smoothes a waveform of the phase difference signal supplied from the phase detector 61 and outputs the signal with the smoothed waveform to the inverters 51-1 to 51-*n*.

Each of the inverters 51-1 to 51-*n* delays the external input on the basis of the signal supplied from the LPF 62.

A lower part of FIG. 6 illustrates waveforms of a signal #1 and delayed signals #2 to #N+1 that are generated by the delay unit 12 and input to the edge selector 13.

The signal #1 is a signal input to the inverter 51-1.

The delayed signal #2 is a signal delayed by the inverter 51-1 and input to the inverter 51-2. The delayed signal #3 is a signal delayed by the inverter 51-2 and input to the inverter 51-3. The delayed signal #4 is a signal delayed by the inverter 51-3 and input to the inverter 51-4. Thereafter, it is similar up to the delayed signal #N. The delayed signal #N+1 is a signal delayed by the inverter 51-*n* and input to the PD 61.

The edge selector 13 selects an edge of a delayed signal according to error time information from the delayed signals #1 to #N+1.

Figure 7:
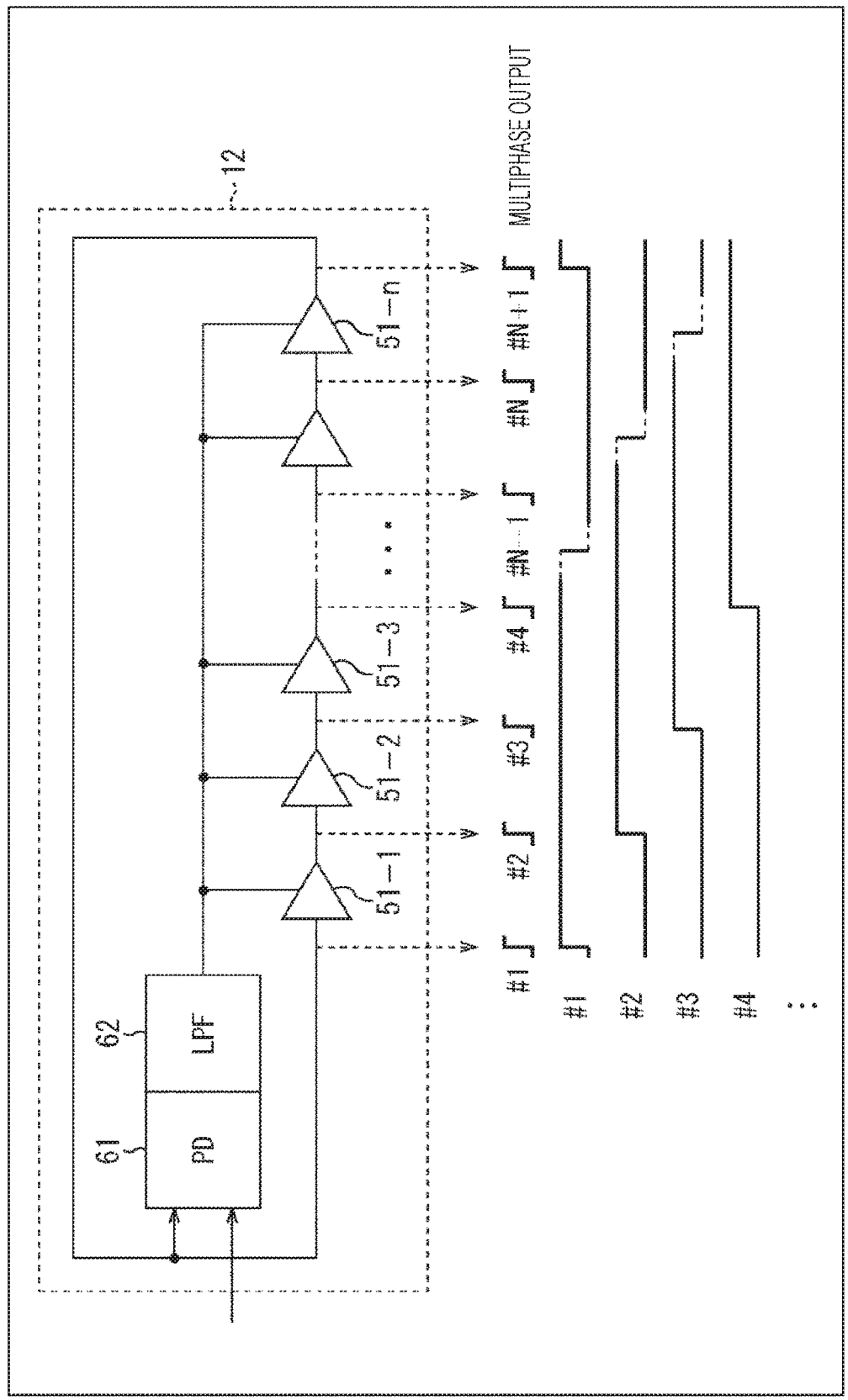
FIG. 7 is a circuit diagram illustrating an example of a case where a delay unit includes a phase locked loop (PLL).

FIG. 7 is a circuit diagram illustrating an example of a case where the delay unit 12 includes a PLL.

The delay unit 12 in FIG. 7 is different in that a PLL output supplied from the inverter 51-*n* is delayed in the inverters 51-1 to 51-*n*, whereas the delay unit 12 in FIG. 6 delays an external input in the inverters 51-1 to 51-*n*.

That is, the signal supplied from the input unit 11 is not input to the inverter 51-1 but is input only to the phase detector 61 as an external input. The PLL output supplied from the inverter 51-*n* is input to the inverter 51-1. Each of the inverters 51-1 to 51-*n* delays the PLL output supplied from the inverter 51-*n* on the basis of the signal supplied from the LPF 62.

Waveforms of delayed signals illustrated in a lower part of FIG. 7 are similar to the waveforms in FIG. 6.

As described above, with the configuration of FIG. 6 or FIG. 7, by using the phase detector 61, a delayed PWM signal synchronized with an externally input clock can be generated.

2. Second Embodiment

Configuration Example of Class D Amplifier of Present Technology

Figure 8:
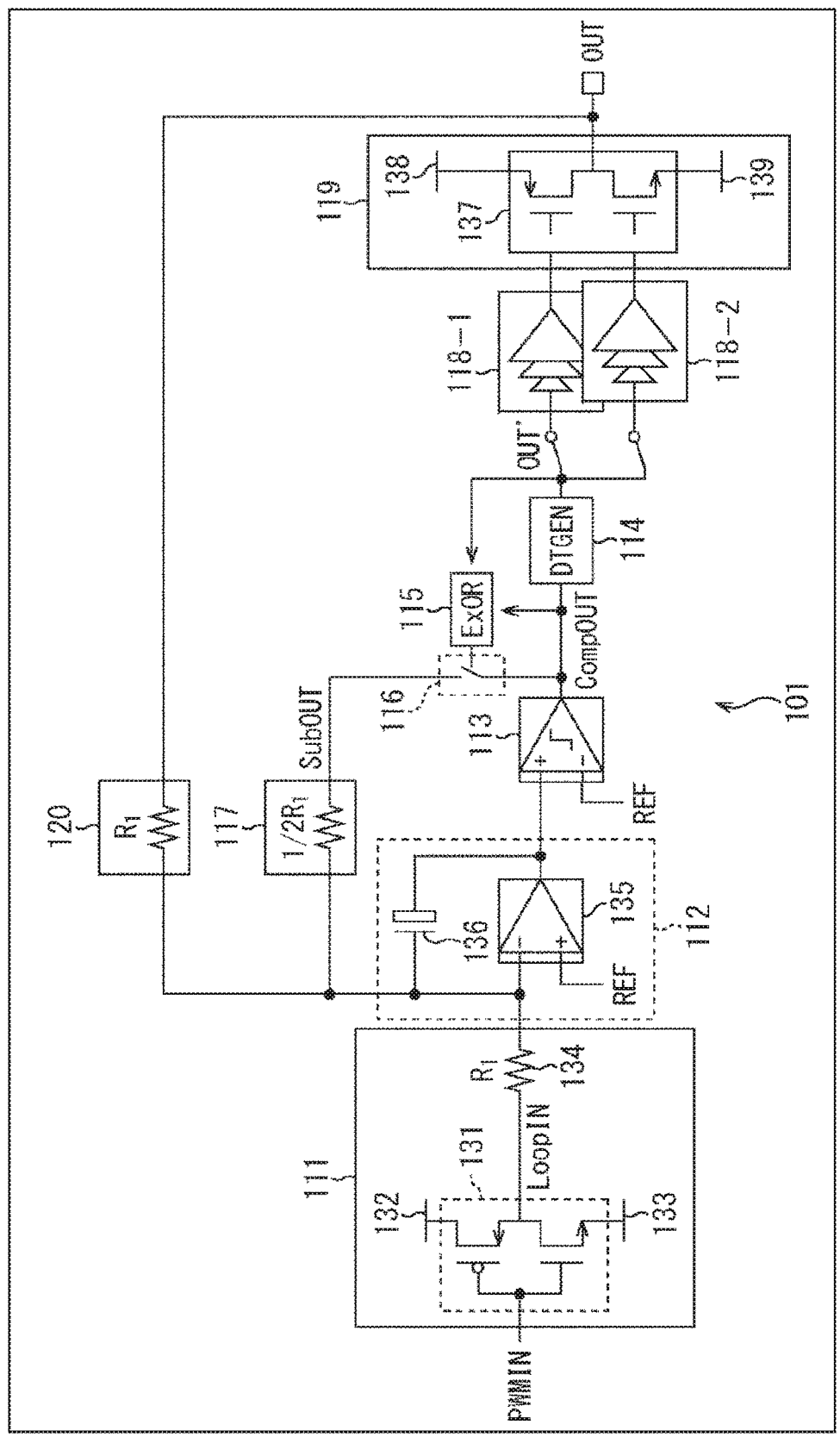
FIG. 8 is a block diagram illustrating a second configuration example of a class D amplifier to which the present technology is applied.

FIG. 8 is a circuit diagram illustrating a second configuration example of a class D amplifier to which the present technology is applied.

A class D amplifier 101 illustrated in FIG. 8 includes an input unit 111, an integrator 112, a comparator 113, a delay circuit 114, a switch control unit 115, a switch 116, and a feedback circuit 117. Furthermore, the class D amplifier 101 includes gate drivers 118-1, 118-2, an output unit 119, and a feedback circuit 120.

An input PWM signal (PWNIN) that is a pulse width modulated signal is input to the class D amplifier 101. The class D amplifier 101 amplifies power of the input PWM signal, and outputs an output PWM signal that is a PWM signal obtained as a result.

The input unit 111 outputs, to the integrator 112, an input PWM signal whose peak value has been changed so as to follow a peak value changed by the output unit 15, similarly to the input unit 11 in FIG. 1.

The input unit 111 includes an inverter 131, a power supply circuit 132, a ground circuit 133, and a variable resistor 134. The inverter 131 and the power supply circuit 132 are configured similarly to the inverter 31 and the power supply circuit 32 of FIG. 1, respectively. The ground circuit 133 corresponds to the power supply circuit 33. A loop input signal (LoopIN) that is a signal before entering a loop including from the integrator 112 to the feedback circuit 120 is input to the variable resistor 134.

The integrator 112 includes an operational amplifier 135 and a capacitor 136. A negative feedback circuit is formed by connecting an output terminal of the operational amplifier 135 to an inversion input terminal of itself via the capacitor 136.

The integrator 112 accumulates an error between the input PWM signal and the output PWM signal. More specifically, the integrator 112 integrates an error signal between the input PWM signal and the output PWM signal supplied from the feedback circuit 120. The integrator 112 outputs, to the comparator 113, an integrator output signal (INTOUT) which is a signal indicating a result of integration.

The comparator 113 includes a hysteresis comparator. The comparator 113 compares the integrator output signal supplied from the integrator 112 with a predetermined reference value (reference voltage REF), and outputs a comparator output signal (CompOUT), which is a signal indicating a result of comparison. The comparator output signal output from the comparator 113 is supplied to the delay circuit 114, the switch control unit 115, and the switch 116.

The delay circuit 114 generates a plurality of delayed signals (OUT') by delaying the comparator output signal supplied from the comparator 113, and outputs the delayed signals to the gate driver 118-1 and the gate driver 118-2. On the basis of the delayed signals output from the delay circuit 114, the gate driver 118-1 and the gate driver 118-2 as well as the output unit 119 are driven in a divided manner. Details of the delay circuit 114 will be described later.

The switch control unit 115 includes an ExOR circuit. The switch control unit 115 turns on the switch 116 when the comparator output signal supplied from the comparator 113 and the output PWN signal supplied from the output unit 119 indicate different states. When the switch 116 is turned on, the comparator output signal output from the comparator 113 is supplied to the feedback circuit 117 as a sub-path output signal (SubOUT).

The switch control unit 115 turns off the switch 116 when the comparator output signal supplied from the comparator 113 and the output PWN signal supplied from the output unit 119 indicate the same state.

The feedback circuit 117 includes a variable resistor having a resistance value of ½. The feedback circuit 117 converts the sub-path output signal supplied from the comparator 113 into a current when the switch 116 is on, and outputs the current to the inversion input terminal of the operational amplifier 135 of the integrator 112.

In a case where resistance values of the variable resistor 134 and a variable resistor of the feedback circuit 120 are set to 1, a resistance value of the variable resistor of the feedback circuit 117 is set to ½. By setting the resistance value of the variable resistor of the feedback circuit 117 to ½, a current from the input unit 111 and a current from the output unit 119 are balanced with a current from the comparator 113.

Each of the gate driver 118-1 and the gate driver 118-2 includes an even number of inverters. The gate driver 118-1 and the gate driver 118-2 drive an inverter of the output unit 119 using the delayed signal supplied from the delay circuit 114.

The output unit 119 includes an inverter 137, a power supply circuit 138, and a ground circuit 139. The inverter 137 includes a PMOS transistor and an NMOS transistor. The power supply circuit 138 outputs, to the inverter 137, a positive-side power supply voltage which is a predetermined voltage value within the variable range. The ground circuit 139 outputs, to the inverter 137, a negative-side power supply voltage which is a predetermined voltage value within the variable range.

The output unit 119 is a switch circuit driven under control of the gate driver 118-1 and the gate driver 118-2. An output PWM signal output from the output unit 119 is output to the outside of the device and also to the feedback circuit 120.

The feedback circuit 120 includes a variable resistor having a resistance value of one. The feedback circuit 120 converts the output PWM signal supplied from the output unit 119 into a current, and supplies the current to the inversion input terminal of the operational amplifier 135 of the integrator 112 to perform feedback (negative feedback).

Configuration Example of Delay Circuit

Figure 9:
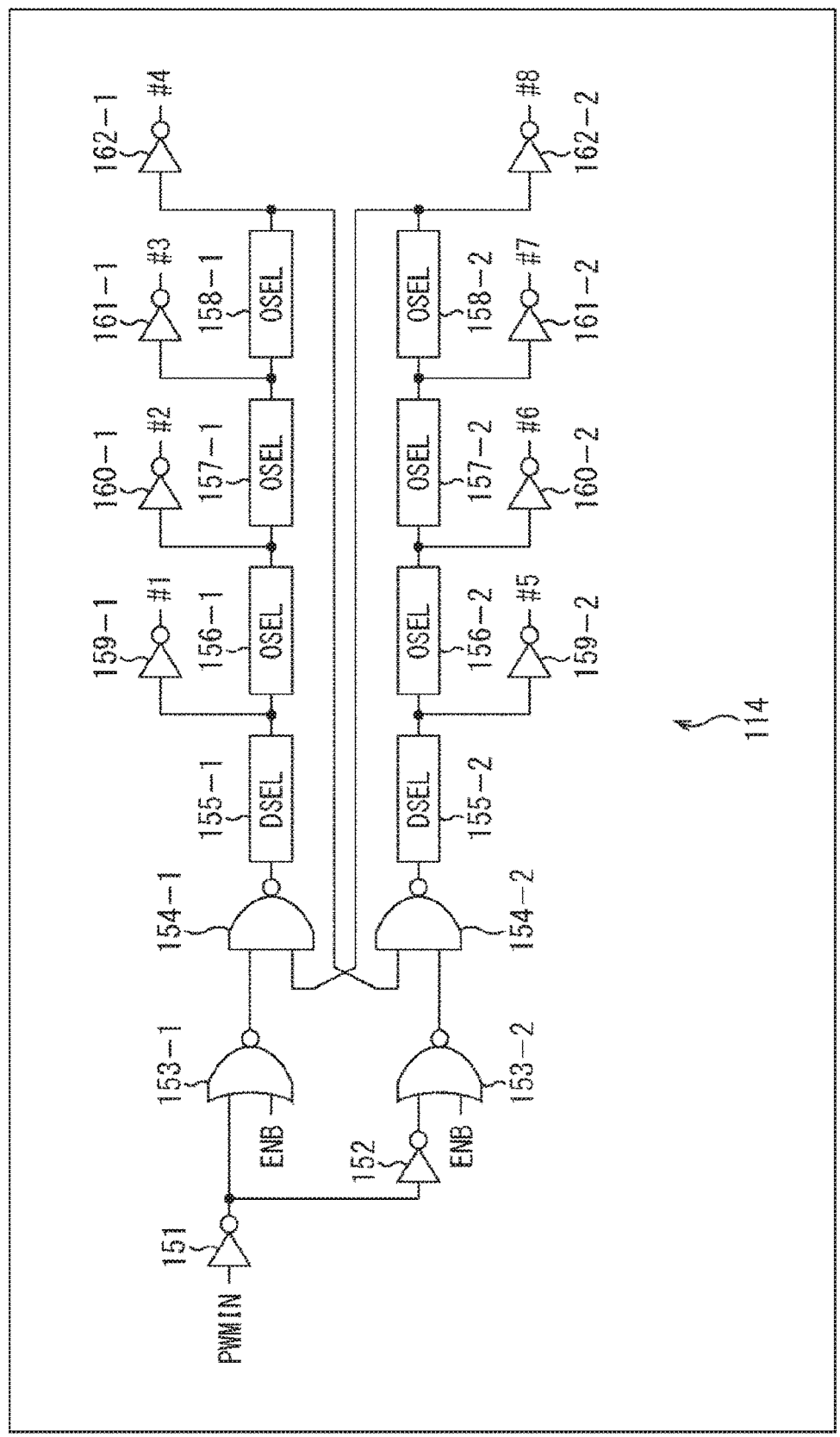
FIG. 9 is a circuit diagram illustrating a configuration example of a delay circuit.

FIG. 9 is a circuit diagram illustrating a configuration example of the delay circuit 114. FIG. 9 illustrates an example in which the number of divisions is two and the number of delay stages is four (the number of selectors is four).

The delay circuit 114 includes an inverter 151, an inverter 152, a NOR circuit 153-1 and a NOR circuit 153-2, and a NAND latch 154-1 and a NAND latch 154-2. Furthermore, the delay circuit 114 includes selectors 155-1 to 158-1, selectors 155-2 to 158-2, inverters 159-1 to 162-1, and inverters 159-2 to 162-2.

The inverter 151 inverts an input PWM signal and outputs the inverted signal to the NOR circuit 153-1 and the inverter 152.

The NOR circuit 153-1 receives the signal supplied from the inverter 151 and an enable signal (ENB), and outputs a result of NOR operation to the NAND latch 154-1.

The NAND latch 154-1 inputs a signal supplied from the NOR circuit 153-1 and a signal supplied from the selector 158-2, and outputs a result of NAND operation to the selector 155-1.

Figure 10:
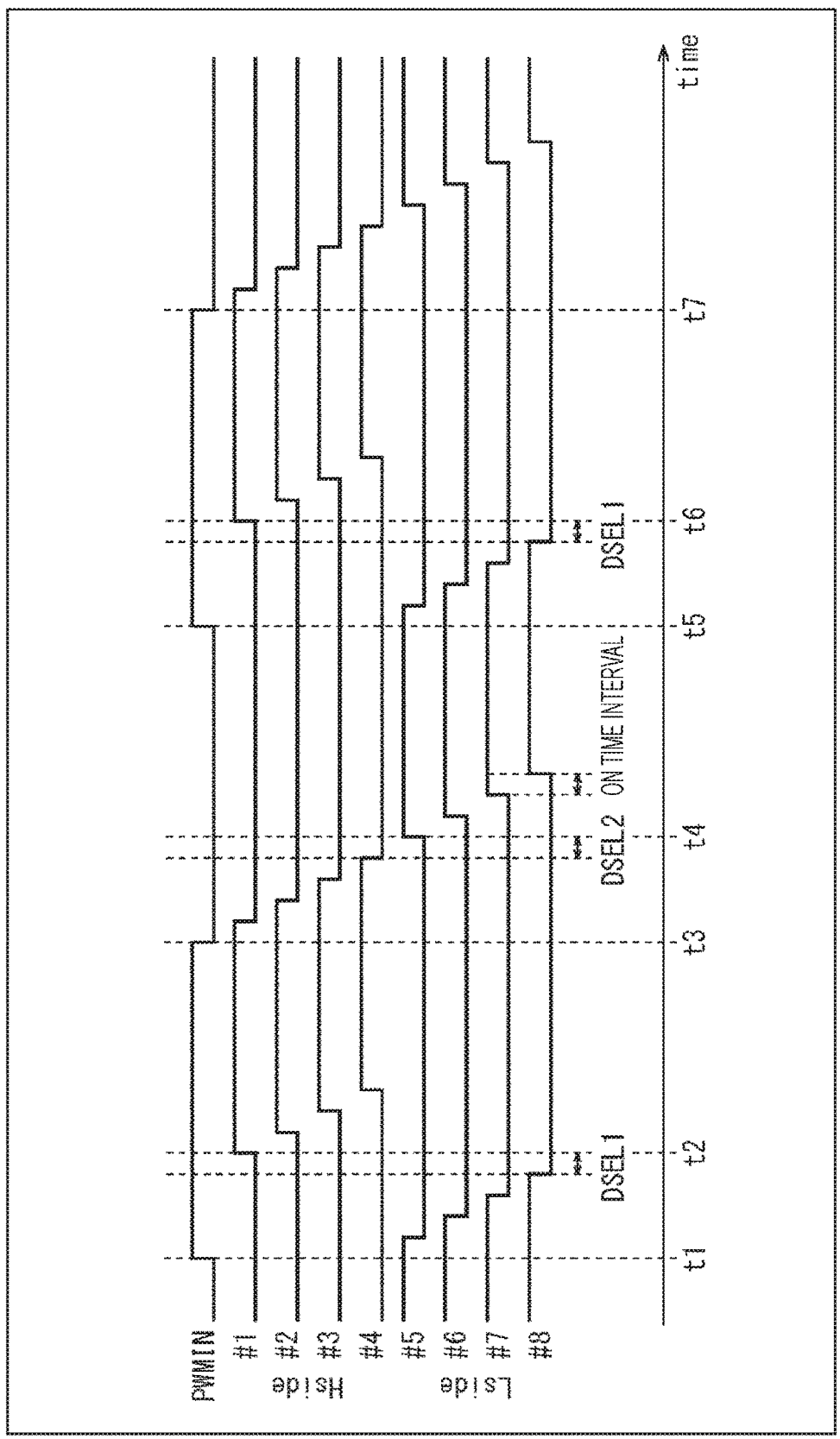
FIG. 10 is a diagram illustrating an operation example of the delay circuit.

The selector 155-1 inputs a signal supplied from the NAND latch 154-1 and outputs, to the inverter 159-1 and the selector 156-1, a signal which becomes an H state after a section denoted by DSEL1 in FIG. 10. DSEL1 denotes a section during which terminals #1 and #8 become H.

The selectors 156-1 to 158-1 input signals supplied from the selectors 155-1 to 1575-1, respectively. The selectors 156-1 to 158-1 output, to the inverters 160-1 to 162-1 and the selector 157-1, the selector 158-1, and the NAND latch 154-2, respectively, signals which become H states with predetermined delay differences.

The inverters 159-1 to 162-1 invert input signals and output the inverted signals to terminals #1 to #4, respectively.

The inverter 152 inverts the signal inverted by inverter 151, and outputs the inverted signal to the NOR circuit 153-2.

The NOR circuit 153-2 receives the signal supplied from the inverter 152 and the enable signal, and outputs a result of NOR operation to the NAND latch 154-2.

The NAND latch 154-2 inputs a signal supplied from the NOR circuit 153-2 and the signal supplied from the selector 158-1, and outputs a result of NAND operation to the selector 155-2.

The selector 155-2 inputs a signal supplied from the NAND latch 154-2 and outputs, to the inverter 159-2 and the selector 156-2, a signal which becomes an H state after a section denoted by DSEL2 in FIG. 10. DSEL2 denotes a section during which the terminals #4 and #5 become H.

The selectors 156-2 to 158-2 input signals supplied from the selectors 155-2 to 1575-2, respectively. The selectors 156-2 to 158-2 output, to the inverters 160-2 to 162-2 and the selector 157-2, the selector 158-2, and the NAND latch 154-1, respectively, signals which become H states with predetermined delay differences.

The inverters 159-2 to 162-2 invert input signals and output the inverted signals to terminals #5 to #8, respectively.

Note that the configuration example in FIG. 9 is an example of the delay circuit 114. The configuration example of the delay circuit 114 is not limited to the configuration example of FIG. 9, and may include another circuit.

FIG. 10 is a diagram illustrating an operation example of the delay circuit of FIG. 9.

In the order from the top to the bottom, an input pulse waveform, which is a waveform of an input PWM signal, and output pulse waveforms, which are waveforms of output signals output from the terminals #1 to #8, are illustrated. The terminals #1 to #4 are H-side terminals, and the terminals #5 to #8 are L-side terminals.

After time t1 at which the input PWM signal becomes an H state, the output signals output from the terminals #5 to #8 sequentially change to L states at every predetermined delay corresponding to ON time intervals. The ON time intervals indicate time intervals during which the selectors 156-2 to 158-2 are turned on.

The output signal output from the terminal #8 becomes an L state, and after the section indicated by DSEL1, the output signal from the terminal #1 becomes an H state. After time t2 when the output signal from the terminal #1 becomes an H state, the output signals from the terminals #2 to #4 sequentially become H states for every predetermined delay difference.

After time t3 when the input PWM signal becomes an L state, the output signals from the terminals #1 to #4 become L states for every predetermined delay difference.

The output signal from the terminal #4 becomes an L state, and after the section indicated by DSEL2, the output signal from the terminal #5 becomes an H state. After time t4 when the output waveform from the terminal #5 becomes an H state, the output signals from the terminals #6 to #8 sequentially become H states for every predetermined delay difference.

After time t5, processing similar to the processing at time t1 and thereafter is repeated.

By the delay circuit 114 configured as illustrated in FIG. 9, it is possible to generate delayed signals corresponding to the number of selectors multiplied by the number of divisions.

Operation Example of Class D Amplifier

Figure 11:
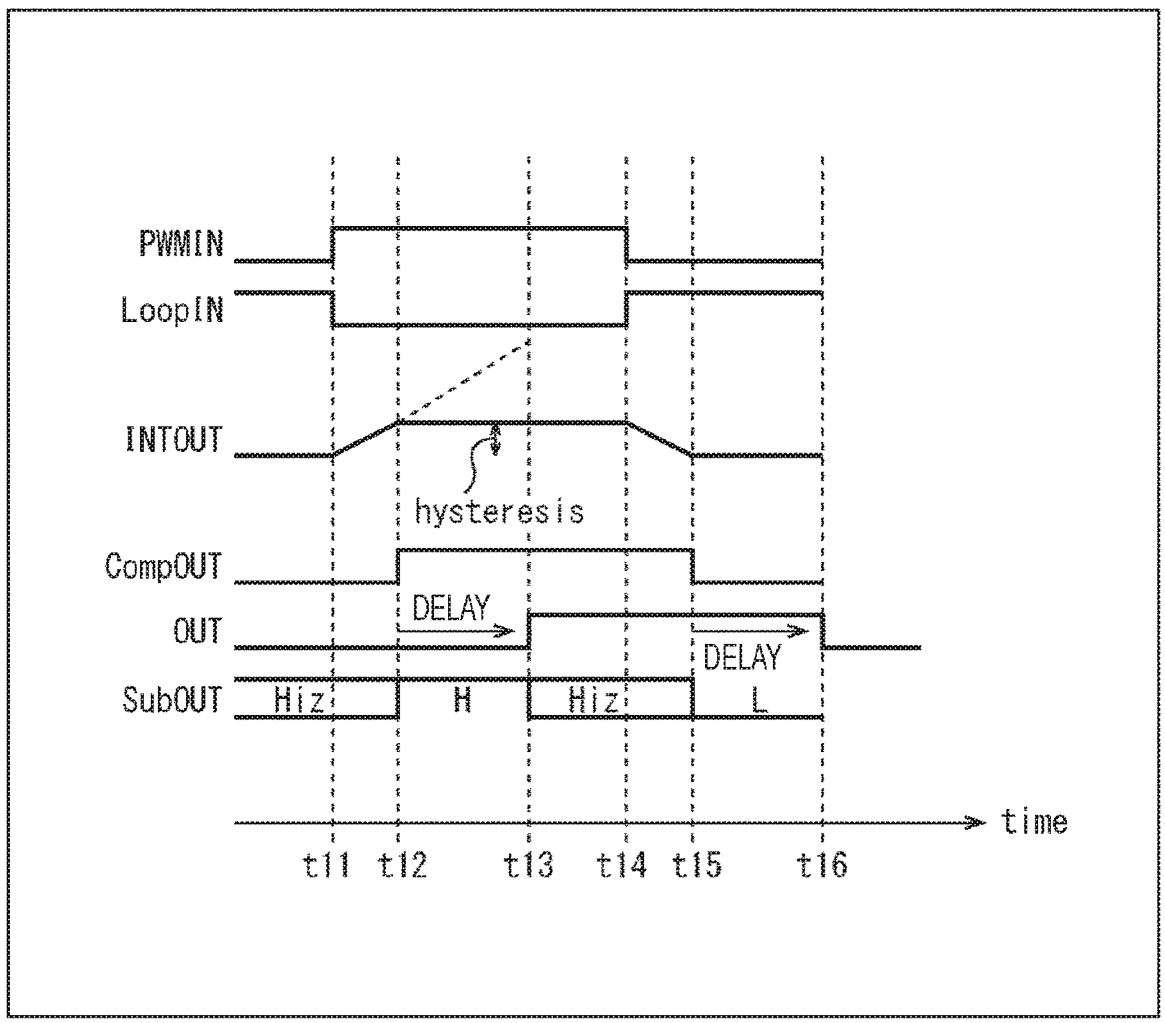
FIG. 11 is a diagram illustrating an operation example of the class D amplifier.

FIG. 11 is a diagram illustrating an operation example of the class D amplifier 101.

From the top, PWMIN denotes a waveform of the input PWM signal input to the input unit 111. LoopIN denotes a waveform of the loop input signal of the variable resistor 134 before entering a loop including the integrator 112 to the feedback circuit 120. INTOUT denotes a waveform of the integrator output that is output from the integrator 112. CompOUT indicates a waveform of the comparator output signal output from the comparator 113.

In principle, OUT denotes a waveform of the output PWM signal output from the output unit 119. The output PWM signal contains analog noise. A current source of the comparator output signal is different from a current source of the output PWM signal. Furthermore, delays generated by the gate driver 118-1 and the gate driver 118-2 and the output unit 119 are so small as to be negligible as compared with delays generated by the delay circuit 114. From the above, substantially, the waveform (OUT') of the delayed signal output from the delay circuit 114 may be used instead of OUT.

SubOUT denotes a waveform of the sub-path output signal output from the switch 116 to the feedback circuit 117.

At time t11 when the input PWM signal becomes an H state, the loop input signal becomes an L state, and the integrator output starts a transition to an H state.

At time t11, the comparator output signal and the output PWM signal are in the same L state. The sub-path output signal indicates Hiz when the switch 116 is off.

At time t12 when the comparator output signal becomes an H state, the output PWM signal is still in the L state due to a delay by the delay circuit 114. Since the state of the comparator output signal and the state of the output PWM signal are different, the switch control unit 115 turns on the switch 116, and the sub-path output signal becomes the H state. When the switch 116 is turned on, the output of the comparator 113 is directly connected to the integrator 112.

Since the output of the comparator 113 is directly connected to the integrator 112, the current from the variable resistor 134 and the current from the feedback circuit 120 to the integrator 112 flow through the feedback circuit 117. Thus, a constant state of the integrator output signal is maintained by an upper threshold of "hysteresis" denoting a hysteresis width formed by two thresholds of the comparator 113. As will be described later, in a conventional configuration that does not use the feedback circuit 117, the integrator output continues to rise as indicated by a dashed line even after time t12 when the comparator output signal becomes the H state.

After the delay by the delay circuit 114, at time t13 when the output PWM signal becomes an H state, the comparator output signal is in an H state. Therefore, the switch control unit 115 turns off the switch 116, and the sub-path output signal indicates Hiz.

At time t14 when the pulse of the input PWM signal becomes an L state, the pulse of the loop input signal becomes an H state, and the pulse of the integrator output signal starts a transition to an L state. At time t14, since the comparator output and the output PWM signal are in the same L state, the pulse of the sub-path output signal indicates Hiz in which the switch 116 is off.

At time t15 when the integrator output becomes the L state and the comparator output signal becomes an L state, the output PWM signal is still in the H state due to a delay by the delay circuit 114. Therefore, the switch control unit 115 turns on the switch 116, and the sub-path output signal becomes an L state. When the switch 116 is turned on, the comparator 113 and the integrator 112 are directly connected.

After the delay by the delay circuit 114, at time t16 when the output PWM signal becomes an L state, the comparator output signal is in an L state. Therefore, the switch control unit 115 turns off the switch 116, and the sub-path output signal indicates Hiz.

Conventionally, in a case where the state of the comparator output signal is different from the state of the output PWM signal, the integrator output signal continues the transition as indicated by the dashed line at time t12. On the other hand, in the present technology, the comparator output signal is directly connected to the integrator 112 only in a case where the state of the comparator output signal is different from the state of the output PWM signal, and thus it is possible to suppress the integrator output signal from continuing the transition and causing the integrator 112 to become saturated.

Furthermore, in the present technology, the comparator output signal is directly connected to the integrator 112, and the value of the variable resistor of the feedback circuit 117 is set to ½. Thus, the current from the variable resistor 134 and the current from the feedback circuit 120 can be balanced with the current from the comparator 113, and thus the transition can be suppressed.

Note that if the feedback of the output PWM signal is stopped while the output PWM signal is delayed, the saturated state of the integrator is suppressed, but the error of the output PWM signal is not corrected. On the other hand, with the present technology, the output PWM signal is connected to the integrator 112 even while the output PWM signal is delayed. Therefore, the error of the output PWM signal is accumulated in the integrator 112, and an error correction can be performed.

Operation Example of Class D Amplifier

Figure 12:
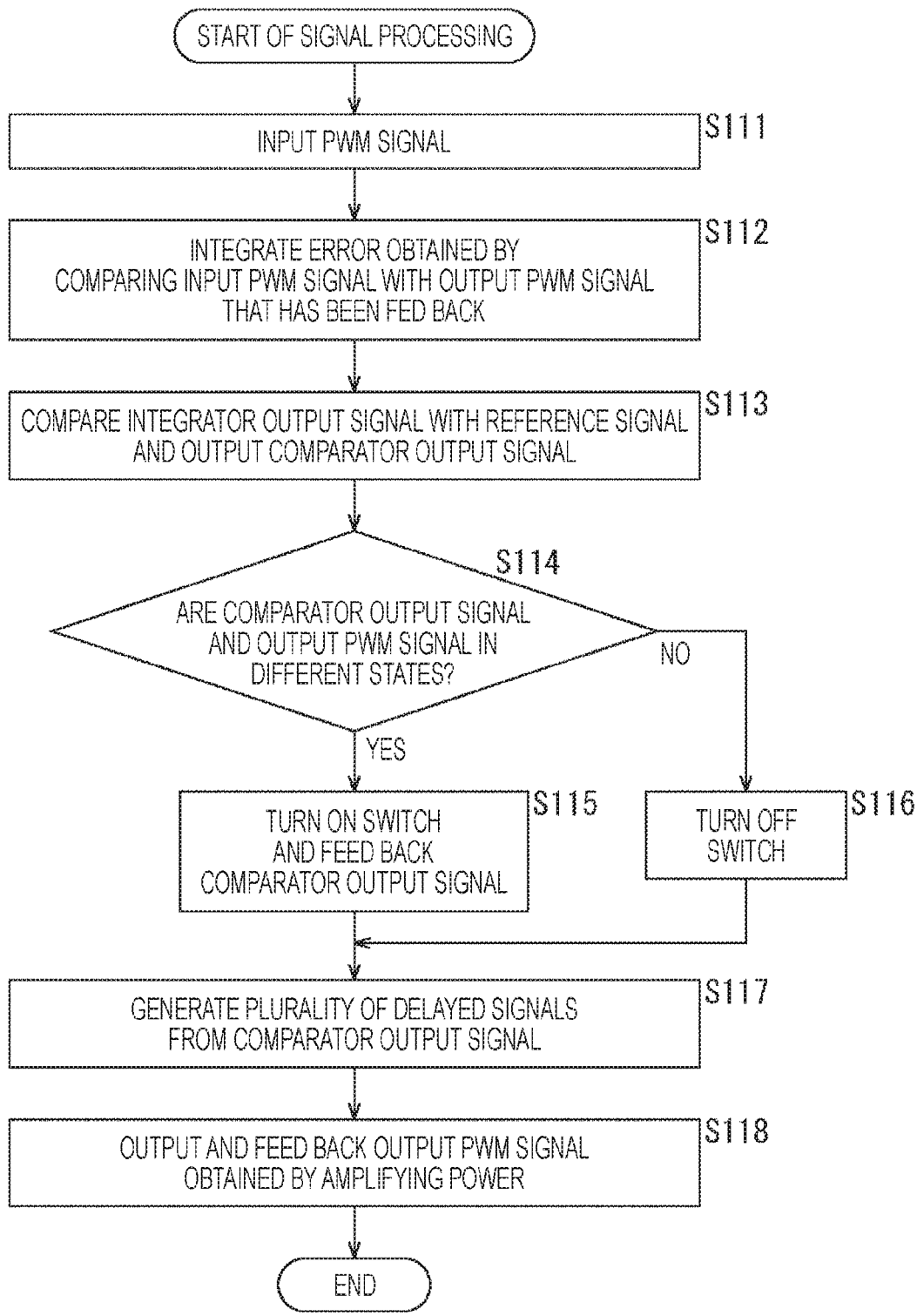
FIG. 12 is a flowchart illustrating signal processing of the class D amplifier in FIG. 8.

FIG. 12 is a flowchart illustrating signal processing of the class D amplifier 101 in FIG. 8.

In step S111, the input unit 111 inputs a PWM signal. The input PWM signal is output to the integrator 112.

In step S112, the integrator 112 integrates an error obtained by comparing the input PWM signal with an output PWM signal that has been fed back. An integrator output signal is output to comparator 113.

In step S113, the comparator 113 compares the integrator output signal with a reference signal and outputs a comparator output signal.

In step S114, the switch control unit 115 determines whether or not the comparator output signal and the output PWM signal are in different states.

In a case where it is determined in step S114 that the states are different, the processing proceeds to step S115. In step S115, the switch control unit 115 turns on the switch 116. Thus, the comparator output signal is fed back to the integrator 112.

In a case where it is determined in step S114 that the states are the same, the processing proceeds to step S116. In step S116, the switch control unit 115 turns off the switch 116.

In step S117, the delay circuit 114 generates a plurality of delayed signals from the comparator output signal. The generated plurality of delayed signals is output to the gate driver 118-1 and the gate driver 118-2.

In step S118, under control of the gate driver 118-1 and the gate driver 118-2, the output unit 119 outputs an output PWM signal obtained by amplifying power, and feeds the output PWM signal back to the integrator 112 via the feedback circuit 120.

As described above, in the present technology, even in a case where a signal transmission delay after correcting an error occurs in the feedback type class D amplifier that feeds back an output error, it is possible to suppress a reduction in the error correction range due to that the feedback to the integrator is delayed by the delay.

Figure 13:
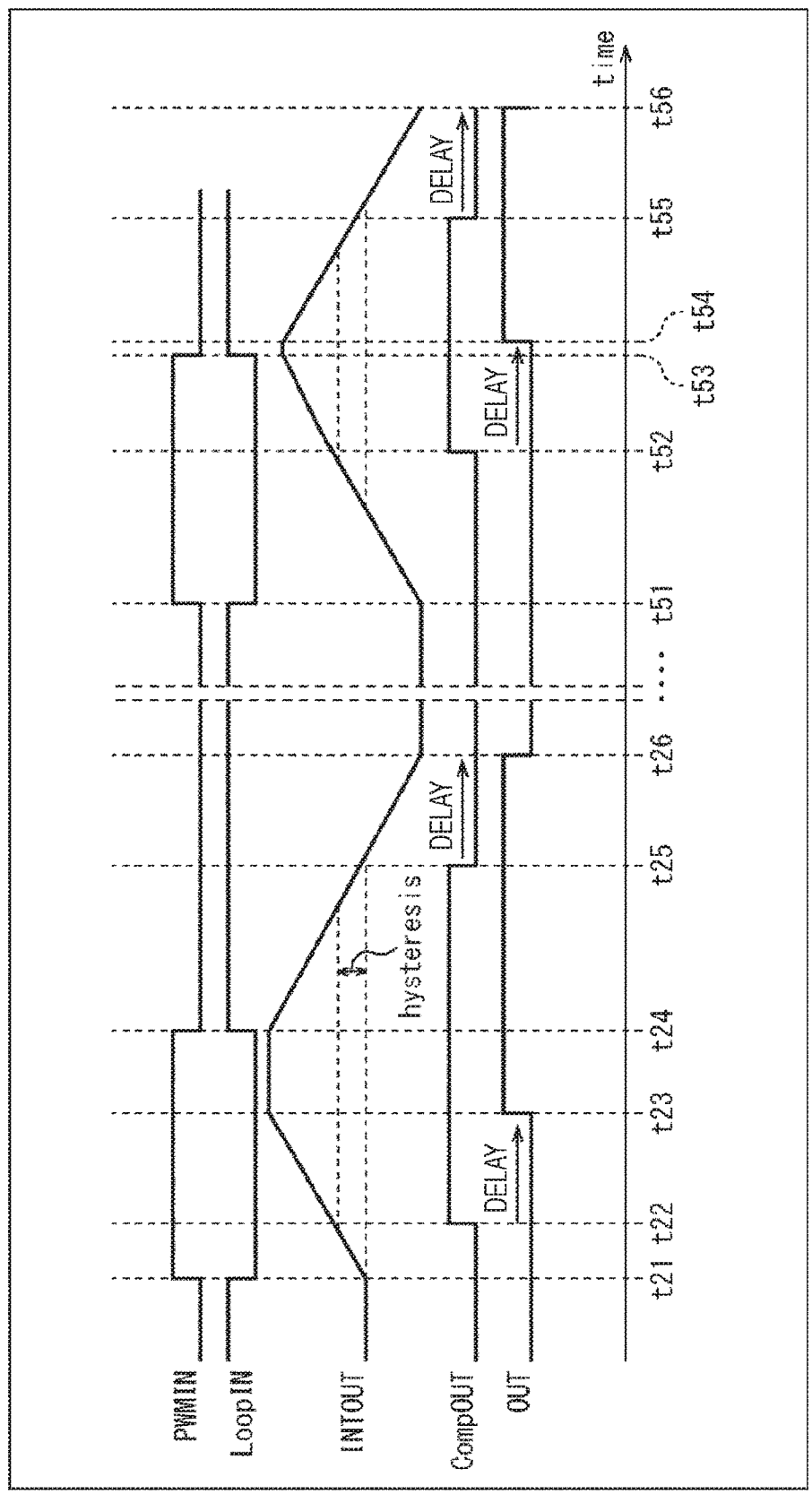
FIG. 13 is a diagram illustrating an operation example of a conventional error correction.

FIG. 13 is a diagram illustrating an operation example of a conventional error correction. FIG. 13 illustrates an operation example in a case where a delay from the comparator 113 exists. That is, a class D amplifier that performs the error correction in FIG. 13 is configured in substantially similar manner as the class D amplifier 101 in FIG. 8 except that the switch control unit 115, the switch 116, and the feedback circuit 117 are removed.

At time t21 when an input PWM signal becomes an H state, a loop input signal becomes an L state, and an integrator output starts a transition to an H state.

At time t22 when a comparator output signal becomes an H state, an output PWM signal is still in an L state due to a delay by the delay circuit 114. Therefore, the integrator output continues the transition.

After the delay by the delay circuit 114, at time t23 when the output PWM signal becomes an H state, the transition of the integrator output stops far beyond a hysteresis width as denoted by "hysteresis", and a constant state is maintained.

At time t24 when the input PWM signal becomes an L state, the loop input signal becomes an H state, and the integrator output starts a transition to an L state.

At time t25 when the integrator output becomes an L state and the comparator output signal becomes an L state, the output PWM signal is still in the H state due to a delay by the delay circuit 114.

After the delay by the delay circuit 114, the output PWM signal becomes an L state at time t26.

Thereafter, similar processing is repeated.

As described above, in the conventional class D amplifier, in a case where a delay occurs in a subsequent stage of the comparator 113, even if the state of the comparator output signal is converted, the state of the output PWM signal does not change due to the delay, and thus the transition of the integrator output does not change. Without the delay, response of the integrator 112 is controlled by thresholds of the comparator 113.

Furthermore, in a case where a delay occurs in the subsequent stage of the comparator 113, the state of the output PWM signal does not change even if the threshold value is exceeded, and thus the transition of the integrator output signal does not change. When the state of the comparator output signal is accompanied by a delay and the accompanying delay appears in the state of the output PWM signal, the integrator output signal changes, and thus the thresholds of the comparator 113 are changed by the delay and a slope of the transition of the integrator output signal.

The integrator output is kept at a constant value when a state that the input PWM signal=output PWM signal occurs, but in a case where an error is involved, the integrator output changes in the error direction. Furthermore, depending on the accumulation of errors, the integrator 112 may saturate beyond the value of the power supply or ground, and may exceed the hysteresis width as indicated by an arrow denoted by "hysteresis", thereby causing an erroneous output. Therefore, in the conventional class D amplifier, it is necessary to carefully design while focusing on the power supply or ground and the hysteresis width to keep an error correction range appropriately.

On the other hand, in the present technology, the comparator output signal is delayed, and the comparator output signal is directly connected to the integrator 112 only in a case where the state of the comparator output signal is different from the state of the output PWM signal. Thus, it is possible to suppress the integrator from becoming saturated due to the delay.

The present technology is not limited to application to a class D amplifier. That is, the present technology is applicable to all electronic devices having a sound output function. The electronic devices having a sound output function includes, for example, a sound reproducing device such as an audio player, a portable terminal device such as a smartphone or a tablet, and a copying machine, a printer, and an imaging device having a sound output function.

Figure 14:
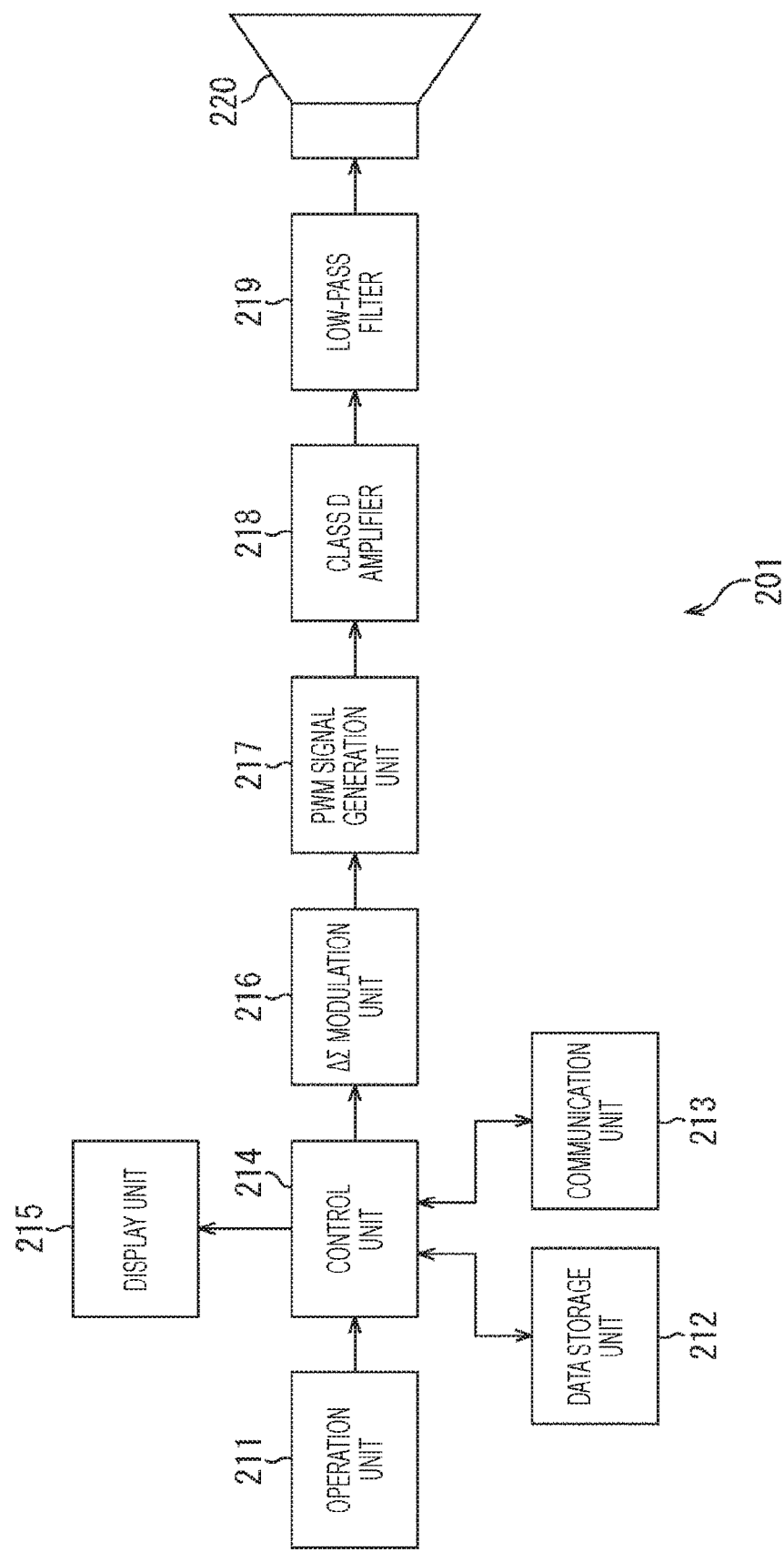
FIG. 14 is a block diagram illustrating a configuration example of an audio player as an electronic device employing the present technology.

FIG. 14 is a block diagram illustrating a configuration example of an audio player as an electronic device employing the present technology.

The audio player 201 in FIG. 14 includes an operation unit 211, a data storage unit 212, a communication unit 213, a control unit 214, a display unit 215, and a ΔΣ (delta sigma) modulation unit 216. The audio player 201 includes a PWM signal generation unit 217, a class D amplifier 218, a low-pass filter 219, and a speaker 220.

The operation unit 211 receives a user operation such as playing or stopping a predetermined music piece (music) stored in the data storage unit 212. The operation unit 211 outputs an operation signal corresponding to the received operation to the control unit 214.

The data storage unit 212 includes, for example, a semiconductor memory and the like. The data storage unit 212 stores data of a plurality of music pieces in a predetermined data format. The predetermined data format includes Moving Picture Experts Group (MPEG)-1 Audio Layer III (MP-3) and the like. Furthermore, the data storage unit 212 also stores a program for the control unit 214 to control operation of the entire audio player 201, and the like.

The communication unit 213 includes, for example, a universal serial bus (USB) interface and the like. The communication unit 213 connects to an external device by control of the control unit 214, and transmits and receives audio data and the like. Furthermore, the communication unit 213 may include a network interface or the like connected to a local area network, the Internet, or another network, or may be connected to an external device via the network to exchange audio data and the like.

The control unit 214 includes, for example, a central processing unit (CPU) and a random access memory (RAM), and the like, and controls operation of the entire audio player 201. For example, the user uses the operation unit 211 to give an instruction to reproduce a predetermined music piece stored in the data storage unit 212. In a case where an operation signal operated by the user is supplied from the operation unit 211, the control unit 214 obtains audio data of the music piece instructed to reproduce from the data storage unit 212, and supplies the audio data to the ΔΣ modulation unit 216. Furthermore, the control unit 214 controls an image displayed on the display unit 215.

The display unit 215 includes, for example, a liquid crystal display (LCD) or an electro-luminescence (EL) display and the like. The display unit 215 displays the title and playback time of the music piece being played back, audio data stored in the data storage unit 212, and the like under control of the control unit 214.

The ΔΣ modulation unit 216 performs ΔΣ modulation process on the audio data supplied from control unit 214, generates ΔΣ-modulated N-bit (N>0) digital data, and outputs the digital data to the PWM signal generation unit 217.

The PWM signal generation unit 217 converts the ΔΣ-modulated N-bit digital data supplied from the ΔΣ modulation unit 216 into a PWM signal and outputs the PWM signal to the class D amplifier 218.

The class D amplifier 218 power-amplifies and outputs the PWM signal supplied from the PWM signal generation unit 217. As a configuration of the class D amplifier 218, the configuration of the class D amplifier 1 in FIG. 1 or the configuration of the class D amplifier 101 in FIG. 8 is employed.

The low-pass filter 219 performs a filter process on the PWM signal output from the class D amplifier 218 to remove high-frequency components, and outputs the filtered signal to the speaker 220. The speaker 220 outputs sound on the basis of the PWM signal supplied from the class D amplifier 218 via the low-pass filter 219.

The ΔΣ modulation unit 216, the PWM signal generation unit 217, and the class D amplifier 218 are all digital circuits, and use of the class D amplifier 218 eliminates the needs for an A/D converter. Thus, the circuit scale can be reduced.

In the audio player 201 configured as described above, since the configuration of the class D amplifier 1 in FIG. 1 described above is employed as the class D amplifier 218, and an integrator that is an analog element is not required, the power can be reduced. Furthermore, since the integrator is not required, it is not necessary to consider the influence caused by integral saturation. Moreover, both edge positions of a PWM signal can be adjusted equally.

Furthermore, in the audio player 201 configured as described above, since the configuration of the class D amplifier 101 in FIG. 8 described above is employed as the class D amplifier 218, it is possible to suppress an integrator from being saturated due to delay. Furthermore, even while the output PWM signal is delayed, error correction of the output PWM signal can be performed.

3. Third Embodiment

Example of General Noise Cancellation Ring System

Figure 15:
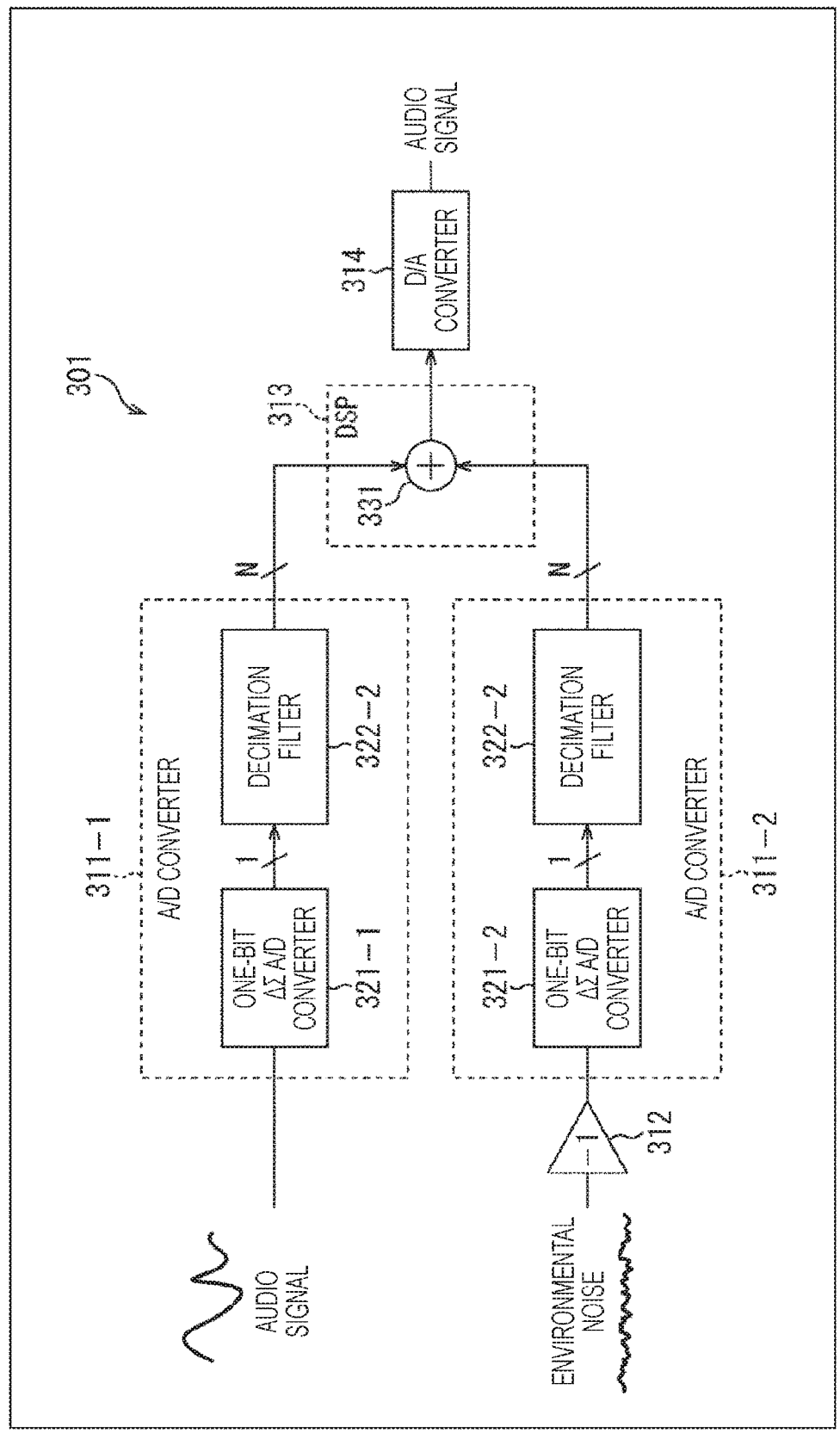
FIG. 15 is a block diagram illustrating a configuration example of a general noise canceling system.

FIG. 15 is a block diagram illustrating a configuration example of a general noise canceling system.

The noise canceling system 301 in FIG. 15 includes an analog-to-digital (A/D) converter 311-1, an A/D converter 311-2, an inverter 312, a digital signal processer (DSP) 313, and a digital-to-analog (D/A) converter 314.

An audio signal for N-bit digital data is input to the A/D converter 311-1. Environmental noise inverted via the inverter 312 is input to the A/D converter 311-2.

The A/D converter 311-1 converts the input audio signal into N-bit digital data. The A/D converter 311-1 outputs the converted N-bit digital data to the DSP 313. The A/D converter 311-1 includes a one-bit ΔΣ A/D converter 321-1 and a decimation filter 322-1.

The A/D converter 311-2 converts the input environmental noise into N-bit digital data. The A/D converter 311-2 outputs the converted N-bit digital data to the DSP 313. The A/D converter 311-2 includes a one-bit ΔΣ A/D converter 321-2 and a decimation filter 322-2.

Hereinafter, the A/D converter 311-1 and the A/D converter 311-2 are referred to as an A/D converter 311 unless it is particularly necessary to distinguish them. The one-bit ΔΣ A/D converter 321-1 and the one-bit ΔΣ A/D converter 321-2 are referred to as a one-bit ΔΣ A/D converter 321 unless it is particularly necessary to distinguish them. The decimation filter 322-1 and the decimation filter 322-2 are referred to as a decimation filter 322 unless it is particularly necessary to distinguish them.

The one-bit ΔΣ A/D converter 321 performs A/D conversion on an input audio signal to generate one-bit digital data. The generated one-bit digital data is output to the decimation filter 322.

The decimation filter 322 converts the one-bit digital data into N-bit digital data. The converted N-bit digital data is output to the DSP 313.

The DSP 313 is supplied with the N-bit digital data output from the A/D converter 311-1 and N-bit inverted digital data output from the A/D converter 311-2.

The DSP 313 has an adder 331. The adder 331 adds two N-bit digital data and outputs the added N-bit digital data to the D/A converter 314.

The D/A converter 314 performs D/A conversion on N-bit digital data supplied from the DSP 313 to generate an analog audio signal. The generated analog audio signal is output to a subsequent speaker or the like.

As described above, the general noise canceling system 301 performs noise cancellation by performing A/D conversion of an audio signal, inverting environmental noise, and adding a cancellation signal, which is an A/D converted signal.

A delay of the cancellation signal affects the amount of cancellation. Therefore, it is desirable that the addition of the A/D conversions of each of the audio signal and the cancellation signal and the D/A conversion for reproducing the added audio signal be performed with as little delay as possible.

However, since high-precision conversion is usually required for A/D conversion, a one-bit ΔΣ A/D conversion method is often used. In the one-bit ΔΣ A/D conversion method, a decimation filter or the like is required as processing after the one-bit A/D conversion, and a processing delay occurs.

Configuration Example of Noise Canceling System of Present Technology

Figure 16:
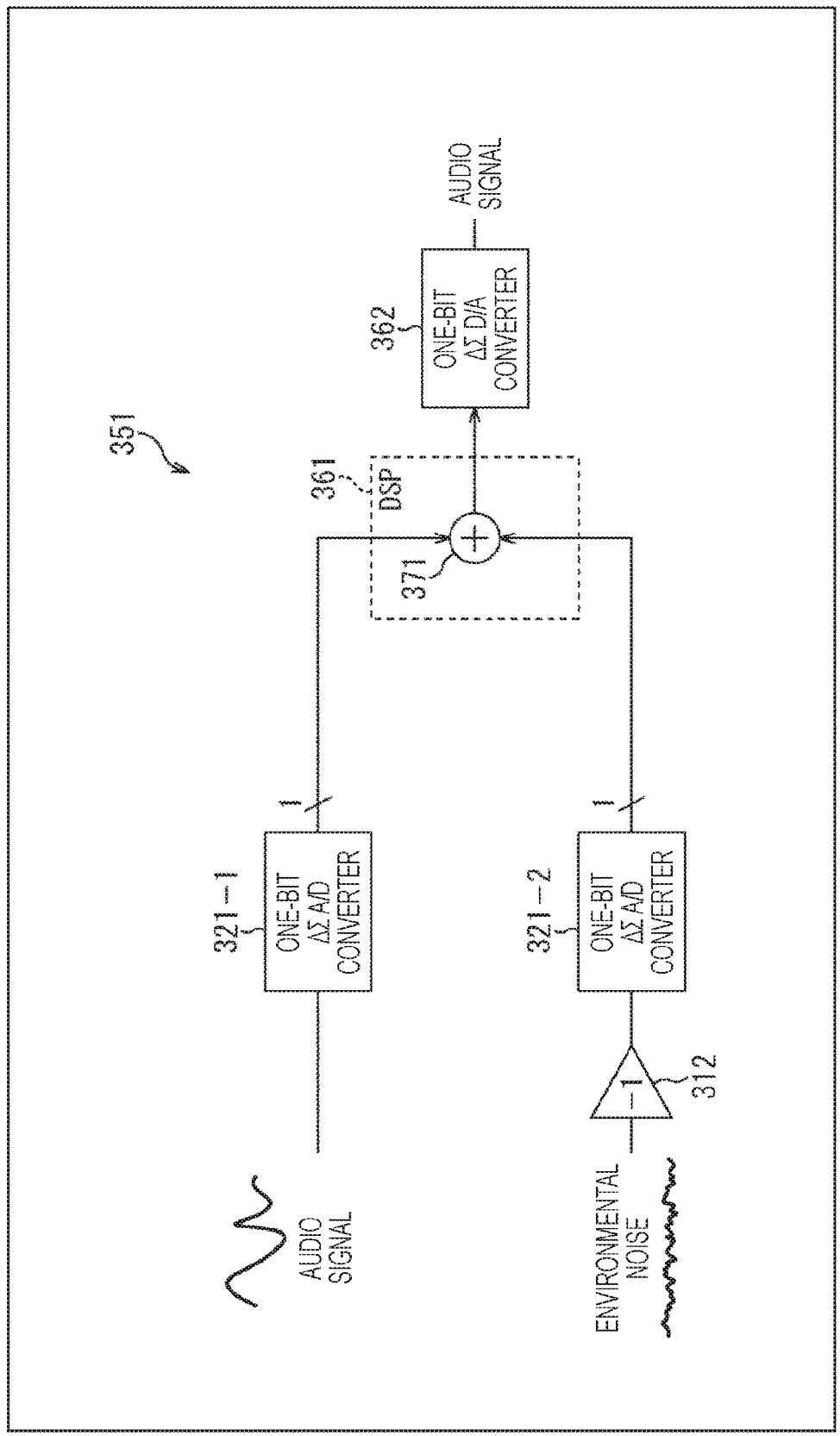
FIG. 16 is a block diagram illustrating a configuration example of a noise canceling system to which the present technology is applied.

FIG. 16 is a block diagram illustrating a configuration example of a noise canceling system to which the present technology is applied. In the configuration of FIG. 16, parts corresponding to the configuration of FIG. 15 are denoted by the same reference numerals.

The noise canceling system 351 illustrated in FIG. 16 includes a one-bit ΔΣ A/D converter 321-1, a one-bit ΔΣ A/D converter 321-2, an inverter 312, a DSP 361, and a one-bit ΔΣ D/A converter 362.

The one-bit ΔΣ A/D converter 321-1 performs A/D conversion of an input audio signal, so as to generate one-bit digital data. The generated one-bit digital data is output to the DSP 361.

The one-bit ΔΣ A/D converter 321-2 performs A/D conversion of environmental noise inverted via the inverter 312, so as to generate one-bit digital data. The generated one-bit digital data is output to the DSP 361.

The DSP 361 has an addition unit 371. The addition unit 371 adds two pieces of one-bit digital data and outputs the added one-bit digital data to the one-bit ΔΣ D/A converter 362.

The one-bit ΔΣ D/A converter 362 performs D/A conversion of the one-bit digital data supplied from the DSP 361 to generate an analog audio signal. The generated analog audio signal is output to a subsequent speaker or the like.

As described above, by the present technology, it is possible to construct a system with a lower delay that does not require a decimation filter that causes a processing delay.

Figure 17:
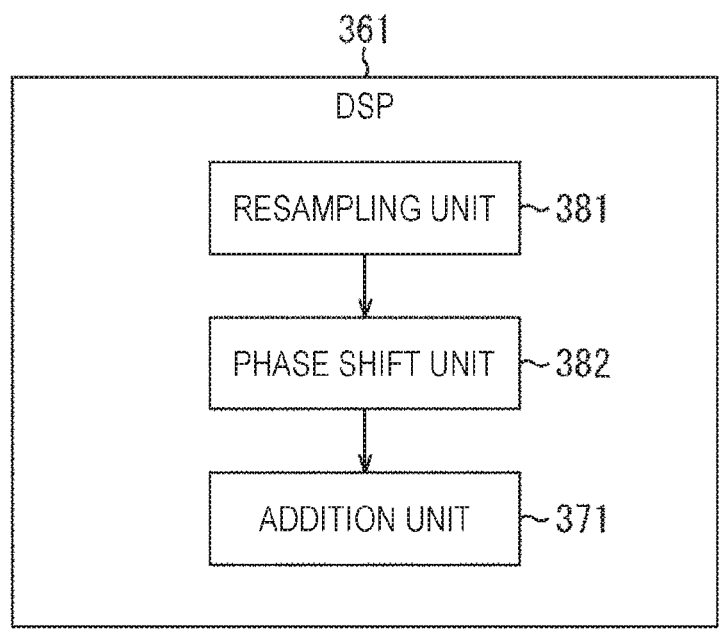
FIG. 17 is a block diagram illustrating a configuration example of a digital signal processor (DSP).

FIG. 17 is a block diagram illustrating a configuration example of the DSP 361.

The DSP 361 in FIG. 17 includes a resampling unit 381, a phase shift unit 382, and an addition unit 371. The one-bit digital data supplied from the one-bit ΔΣ A/D converter 321-1 and the one-bit digital data supplied from the one-bit ΔΣ A/D converter 321-2 are input to the resampling unit 381.

The resampling unit 381 resamples a plurality of one-bit signals input, so as to increase the data rate to two times or more.

The phase shift unit 382 shifts the phase of one of the two pieces of one-bit digital data by 180° as necessary.

The addition unit 371 adds one of one-bit signals with a shifted phase and the other of the one-bit digital data with a non-shifted phase.

Figure 18:
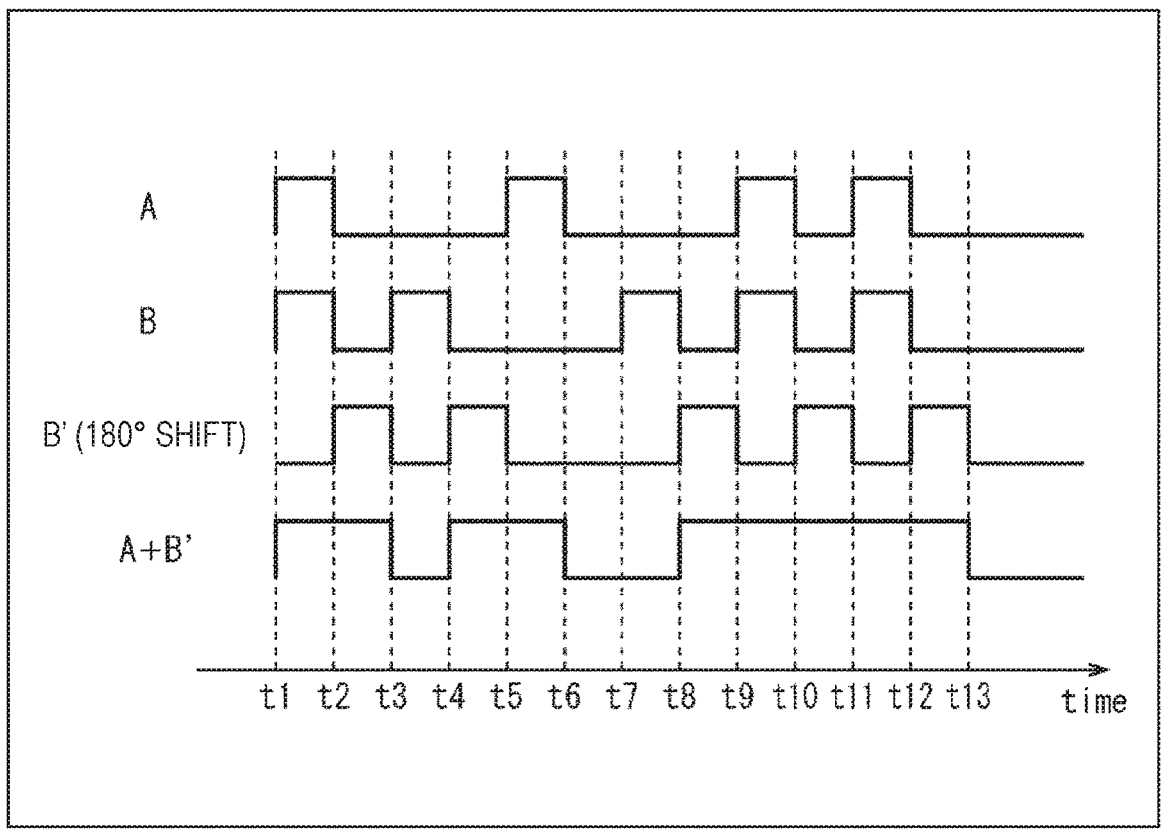
FIG. 18 is a diagram illustrating an example of direct addition by shifting a return to zero (RTZ) signal by 180°.

FIG. 18 is a diagram illustrating an example of direct addition by shifting an RTZ signal by 180°. In FIG. 18, a method of adding one bit as one bit without change will be described.

A indicates one-bit digital data supplied from the one-bit ΔΣ A/D converter 321-1. B indicates one-bit digital data supplied from the one-bit ΔΣ A/D converter 321-2. B' indicates digital data in which the phase of B is shifted by 180°. A+B' indicates digital data obtained by adding the digital data of A and the digital data of B'.

A period from time t3 to time t4, a period from time t5 to time t6, and a period from time t7 to time t8 are periods in which one of A and B is one, and thus it is possible to add A and B.

However, a period from time t1 to time t2, a period from time t9 to time t10, and a period from time t11 to time t12 are periods in which both A and B are one and cannot be added, and thus B' whose phase is shifted by 180° is used.

A period from time t1 to time t2, a period from time t5 to time t6, a period from time t9 to time t10, and a period from time t11 to time t12 are periods in which A is in a state of one and B' is in a state of zero. A period from time t2 to time t3, a period from time t4 to time t5, a period from time t8 to time t9, a period from time t10 to time t11, and a period from time t12 to time t13 are periods in which A is in a state of zero, and B' is in a state of one. The rests are periods in which both are in states of zero.

As indicated by B', by shifting the phase of one data B by 180°, it is not a period in which both A and B' are in a state of one, and thus the data of A and B' can be added when A is in a state of zero.

As indicated by A+B', an addition result of A and B' becomes a state of one in a period from time t1 to time t3, a period from time t4 to time t6, and a period from time t8 to time t13, and becomes zero in other periods.

Figure 19:
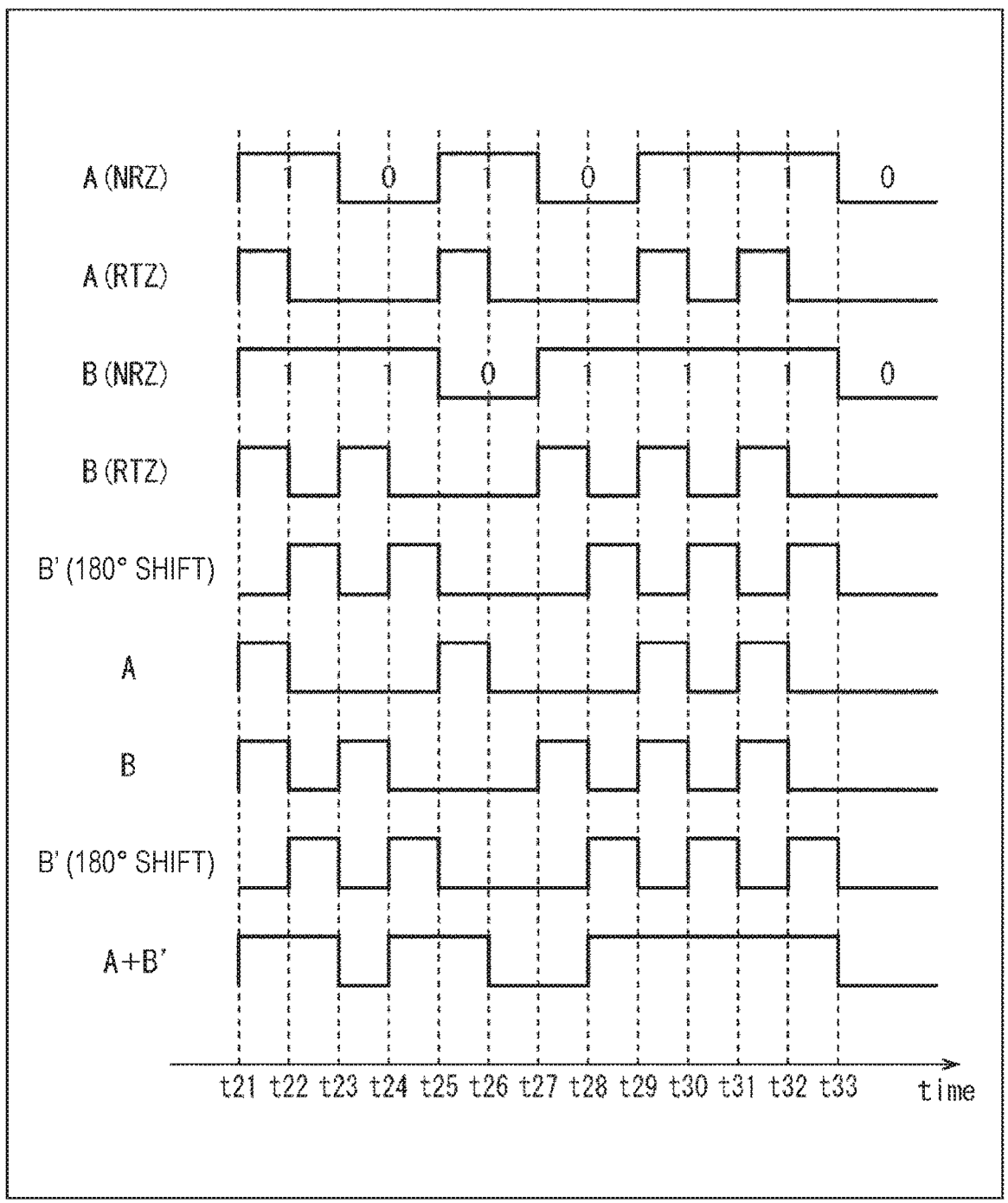
FIG. 19 is a diagram illustrating an example of direct addition of one-bit data.

FIG. 19 is a diagram illustrating an example of direct addition of one-bit data.

A (NRZ) in the first row denotes a waveform of one-bit digital data of the NRZ signal. A (NRZ) is in a state of one in a period from time t21 to time t23, a period from time t25 to time t27, and a period from time t29 to time t33, and in a state of zero in other periods.

A (RTZ) in the second row denotes a waveform of one-bit digital data of the RTZ signal. A (RTZ) is in a state of one in a period from time t21 to time t22, a period from time t25 to time t26, a period from time t29 to time t30, and a period from time t31 to time t32, and is in a state of zero in other periods.

B (NRZ) in the third row denotes a waveform of one-bit digital data of the NRZ signal. B (NRZ) is in a state of one in the period from time t21 to time t25, and a period from time t27 to time t33, and in a state of zero in other periods.

B (RTZ) in the fourth row denotes a waveform of one-bit digital data of the RTZ signal. B (RTZ) is in a state of one in the period from time t21 to time t22, a period from time t23 to time t24, a period from time t27 to time t28, a period from time t29 to time t30, and the period from time t31 to time t32, and in a state of zero in other periods.

B' (180° shift) in the fifth row indicates a waveform of digital data in which the phase of B (RTZ) is shifted by 180°. In B' (180° shift), B (RTZ) is shifted by 180°. B' (180° shift) is in a state of one in a period from time t22 to time t23, a period from time t24 to time t25, a period from time t28 to time t29, a period from time t30 to time t31, and a period from time t32 to time t33, and in a state of zero in other periods.

A in the sixth row denotes a waveform of second A (RTZ).

B in the seventh row denotes a waveform of fourth B (RTZ).

B' (180° shift) in the eighth row indicates a waveform of fifth B' (180° shift).

A+B' in the ninth row indicates a waveform of digital data obtained by adding sixth digital data of A and eighth digital data of B'. A+B' is one in the period from time t21 to time t23, a period from time t24 to time t26, and a period from time t28 to time t33, and is zero in other periods.

One-bit data already has one-bit amplitude. Thus, if direct addition is to be performed, it is necessary to extend one-bit data to usually two bits. However, in a case where it is desired to perform processing in a subsequent stage with one bit, addition of signals becomes possible by adjusting data widths to provide a gap in one-bit data.

That is, the resampling unit 381 in FIG. 17 treats two one-bit data strings as non return to zero (NRZ) as illustrated in first A (NRZ) and third B (NRZ) and resample at a double rate, so as to produce an RTZ signal. Using the RTZ signal corresponds to changing the data width by half, as indicated by the second A (RTZ) and the fourth B (RTZ).

The phase shift unit 382 shifts the phase of the two pieces of data as the RTZ signal by 180°. Thus, the addition unit 371 can add data to one of portions of zero data, and can achieve direct addition of one bit as illustrated by the eighth B' of results of shifting sixth A and seventh B.

Figure 20:
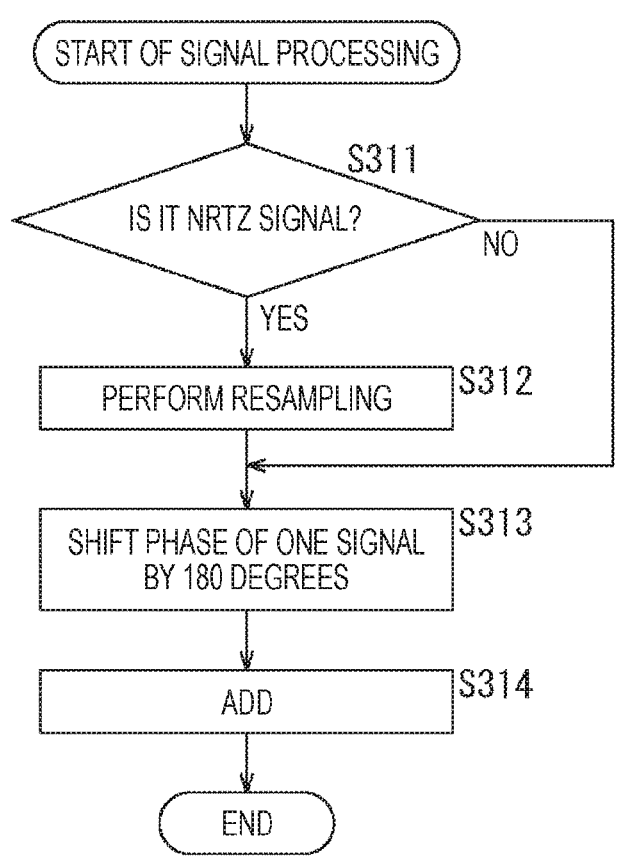
FIG. 20 is a flowchart illustrating signal processing of the DSP in FIG. 17.

FIG. 20 is a flowchart illustrating signal processing of the DSP 361 in FIG. 17.

In step S311, the resampling unit 381 determines whether or not input one-bit data is an NRTZ signal. In a case where it is determined in step S311 that it is an NRTZ signal, the processing proceeds to step S312.

In step S312, the resampling unit 381 resamples the one-bit data at a double rate.

In a case where it is determined in step S311 that it is an RTZ signal, the processing of step S312 is skipped, and the processing proceeds to step S313.

In step S313, the phase shift unit 382 shifts the phase of one data by 180°.

In step S314, the addition unit 371 adds the other data and the one data whose phase has been shifted.

With the configuration as described above, direct addition of one bit can be achieved.

Note that the data width may be of any value, and if the data width is changed as desired, it is possible to add a gain to a plurality of signals for addition.

Figure 21:
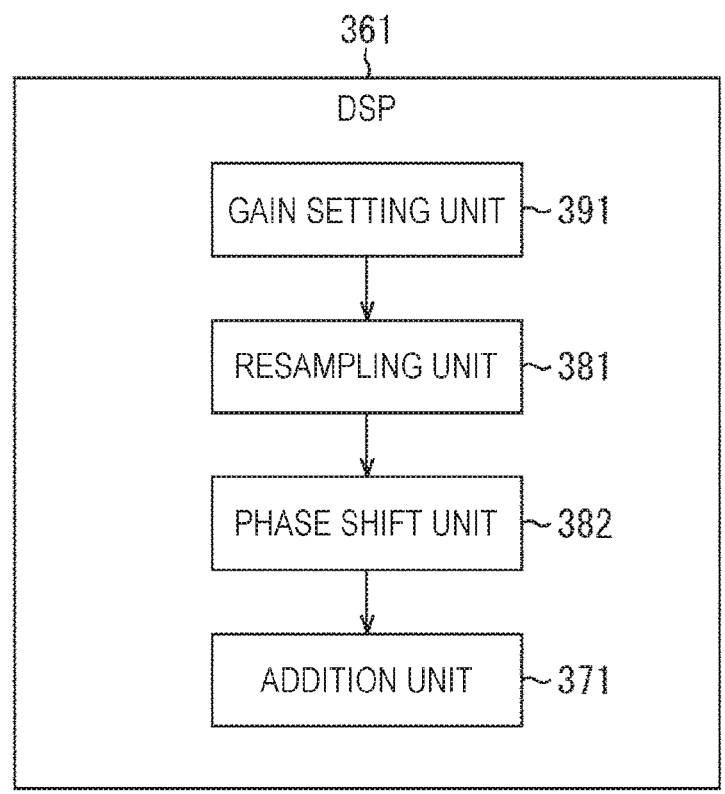
FIG. 21 is a block diagram illustrating a configuration example of a DSP in a case where a data width is changed as desired.

FIG. 21 is a diagram illustrating a configuration example of the DSP 361 in a case where the data width is changed as desired.

The DSP 361 in FIG. 21 is common to the DSP 361 in FIG. 17 in that the DSP 361 includes a resampling unit 381, a phase shift unit 382, and an addition unit 371. The DSP 361 in FIG. 21 differs from the DSP 361 in FIG. 17 in that a gain setting unit 391 is added.

That is, the gain setting unit 391 sets an α-fold gain for data A and a β-fold gain for data B for two pieces of data A and B. As long as the two pieces of data do not overlap and α+β>1 is not true, the values of α and β can be freely set.

The resampling unit 381 performs resampling on the basis of the α-fold gain and the β-fold gain set by the gain setting unit 391.

The phase shift unit 382 shifts the phase of a signal to which a gain has been added as necessary.

Figure 22:
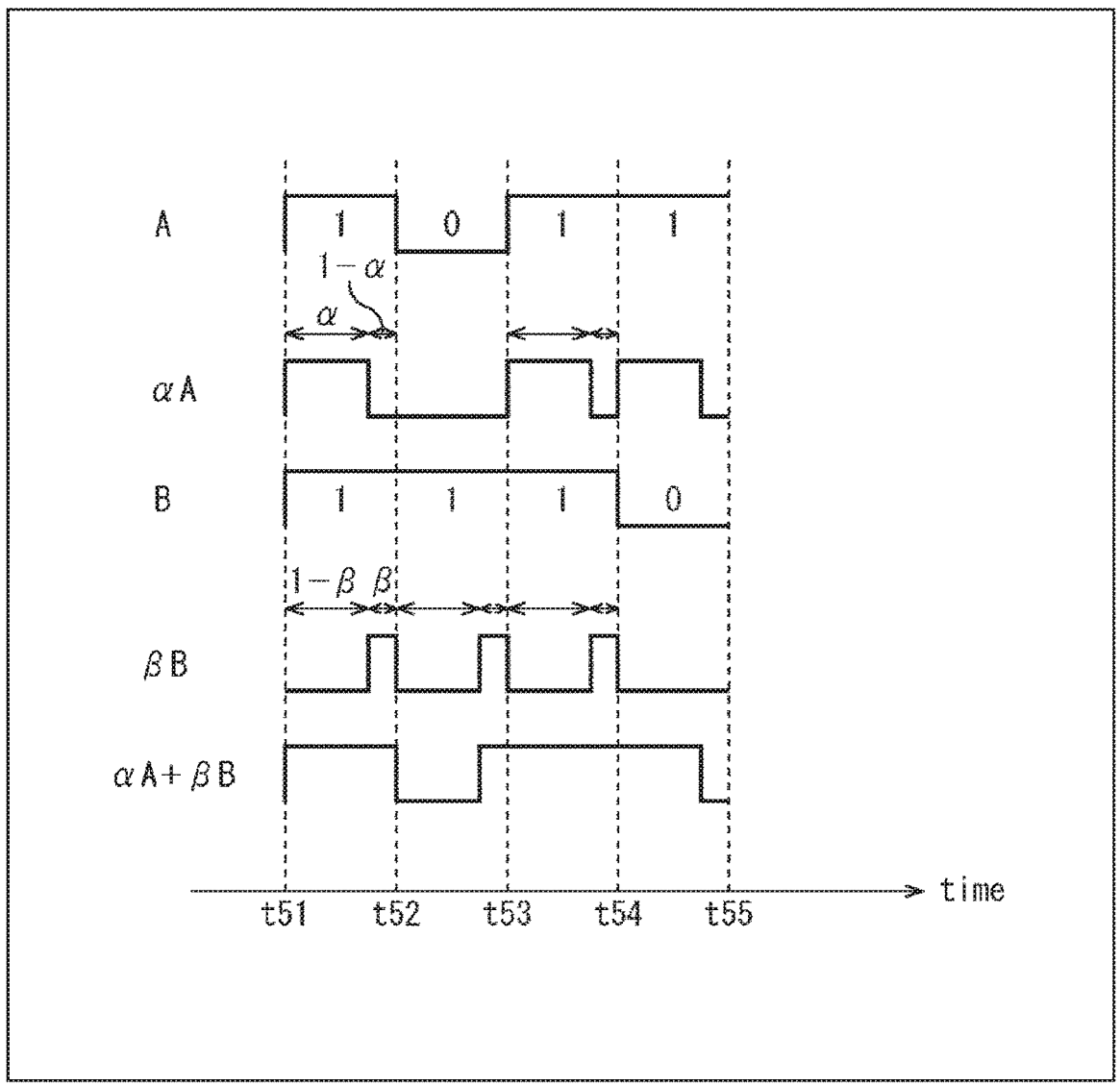
FIG. 22 is a diagram illustrating an example of direct addition of one-bit data in a case where the data width is changed as desired.

FIG. 22 is a diagram illustrating an example of direct addition of one-bit data in a case where the data width is changed as desired.

A in the first row denotes a waveform of one-bit digital data from the one-bit ΔΣ A/D converter 321-1. A is in a state of one in a period from time t51 to time t52 and a period from time t53 to time t55, and in a state of zero in other periods.

αA in the second row is in a state of one only for α and in a state of zero for (1−α) because of the gain in a period between time t51 and time t52, a period from time t53 to time t54, and a period from time t54 to time t55. αA is in a state of zero in other periods.

B in the third row denotes a waveform of one-bit digital data from the one-bit ΔΣ A/D converter 321-2. B is in a state of one during a period from time t51 to time t54, and in a state of zero in other periods.

βB in the fourth row is in a state of one only for (1−β) and in a state of zero for β because of the gain in a period from time t51 to time t52, a period from time t52 to time t53, and a period from time t53 to time t54. βB is zero in other periods.

αA+βB in the fifth stage is in a state of one in the period from time t51 to time t52, and in a state of zero only for α and in a state of one for remaining β in the period from time t52 to time t53. αA+βB is in a state of one in the period from time t53 to time t54, in a state of one only for α and in a state of zero for remaining β in the period from time t54 to time t55.

The data rate after the addition result is converted, and the data rate depends on gains such as α and β. As illustrated in FIG. 19 described above, in a case where the RTZ signal is used, since the gain is ½, the data rate after addition is doubled.

Figure 23:
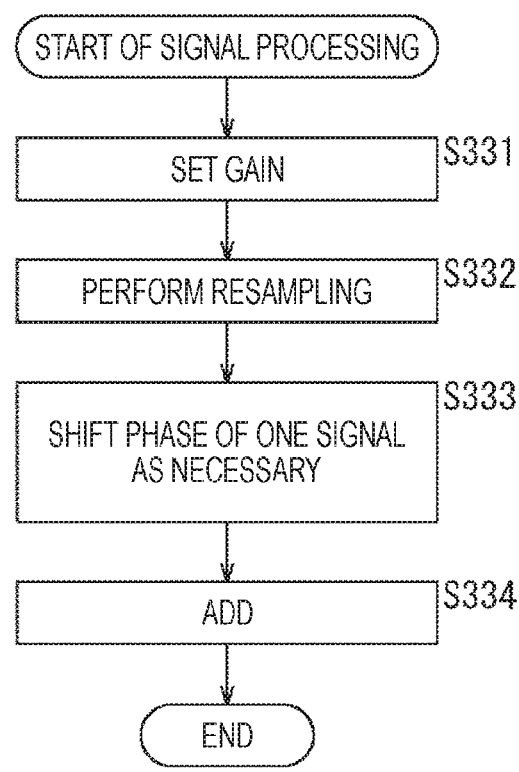
FIG. 23 is a flowchart illustrating signal processing of the DSP in FIG. 21.

FIG. 23 is a flowchart illustrating signal processing of the DSP 361 in FIG. 21.

In step S331, the gain setting unit 391 sets an α-fold gain for data A and a β-fold gain for data B for two pieces of data A and B.

In step S332, the resampling unit 381 performs resampling on the basis of the α-fold gain and the β-fold gain set by the gain setting unit 391.

In step S333, the phase shift unit 382 shifts the phase of one data as necessary.

In step S334, the addition unit 371 adds the other data and the one data whose phase has been shifted.

With the configuration as described above, direct addition of one bit can be achieved.

By the present technology, it is possible to perform addition to one-bit data without using a bit extension or a decimation filter, and a low-latency system can be built.

The present technology can be applied to, for example, a logic in a subsequent stage of a one-bit ΔΣ converter.

Furthermore, in the above description, an example in which the present technology is used for a noise canceling system has been described. However, without being limited to the noise canceling system, the present technology can be applied to an audio system using a one-bit ΔΣ converter.

Note that in the present description, a system means a set of a plurality of components (devices, modules (parts), and the like), and it does not matter whether or not all the components are in the same housing. Therefore, a plurality of devices housed in separate housings and connected via a network, and one device with a plurality of modules housed in one housing are both systems.

Furthermore, the effects described herein are merely examples and are not limited, and other effects may be provided.

The embodiments of the present technology are not limited to the above-described embodiments, and various modifications are possible without departing from the scope of the present technology.

For example, the present technology can take a configuration of cloud computing in which one function is shared by a plurality of devices via a network and processed jointly.

Furthermore, each step described in the above-described flowcharts can be executed by one device, or can be executed in a shared manner by a plurality of devices.

Moreover, in a case where a plurality of processes is included in one step, the plurality of processes included in the one step can be executed in a shared manner by a plurality of devices in addition to being executed by one device.

The preferred embodiments of the present disclosure have been described in detail above with reference to the accompanying drawings, but the present disclosure is not limited to such examples. It is apparent that a person having ordinary knowledge in the technical field to which the present disclosure belongs can devise various change examples or modification examples within the scope of the technical idea described in the claims, and it will be naturally understood that they also belong to the technical scope of the present disclosure.

Note that the present technology can also have configurations as follows.

(1)

An amplifier including:

a voltage-to-time converter (VTC) that integrates error information included in an output pulse width modulation (PWM) signal that is a PWM signal to be output to an outside of a device, so as to convert the error information into error time information;

a delay unit that generates a plurality of delayed signals using an input PWM signal that is a PWM signal input from the outside of the device; and a signal selection unit that selects a delayed signal according to the error time information from the plurality of delayed signals and outputs the output PWM signal.

(2)

The amplifier according to above (1), in which the signal selection unit adjusts a signal width of the output PWM signal by selecting a delayed signal according to the error time information, and the amplifier further includes an output unit that outputs the output PWM signal having the adjusted signal width to the VTC and to the outside of the device.

(3)

The amplifier according to above (1) or (2), in which the delay unit includes a plurality of inverters.

(4)

The amplifier according to above (1) or (2), in which the delay unit includes a delay locked loop (DLL) circuit.

(5)

The amplifier according to above (1) or (2), in which the delay unit includes a phase locked loop (PLL) circuit.

(6)

An amplifier including:

a first feedback unit that feeds back an output pulse width modulation (PWM) signal that is a PWM signal to be output to an outside of a device;

an integrator that integrates a difference error obtained by comparing an input PWM signal that is a PWM signal input from the outside of the device with the output PWM signal that has been fed back;

a comparator that has one or more threshold values so as to change a signal width of the output PWM signal according to the integrated difference error;

a plurality of output units that outputs the output PWM signal;

a delay unit that delays a signal output from the comparator so that the plurality of output units operates in a stepwise manner; and a second feedback unit that feeds a signal output from the comparator back to the integrator in a section during which a value of the signal output from the comparator and a value of the output PWM signal are different.

(7)

The amplifier according to above (6), further including:

a switch provided between the comparator and the second feedback unit; and a switch control unit that controls opening and closing of the switch so as to connect the comparator and the second feedback unit in the section during which the value of the signal output from the comparator and the value of the output PWM signal are different.

(8)

A signal processing circuit including:

a resampling unit that increases a data rate of two or more one-bit oversampled data to two times or more;

a phase shift unit that shifts a phase of the data in which the data rate has been increased to two times or more; and an addition unit that adds the data whose phase has been shifted.

(9)

The signal processing circuit according to above (8), in which the resampling unit increases the data rate of the data to two times or more in a case where the data is an NRT signal.

(10)

The signal processing circuit according to above (8), further including a gain setting unit that sets a gain of $\alpha$ to one of the data and sets a gain of $\beta$ to the other data of the data ($\alpha+\beta\leq1$), in which the resampling unit increases the data rate of the data to two times or more on the basis of the gain of $\alpha$ and the gain of $\beta$ which are set.

REFERENCE SIGNS LIST

1 Class D amplifier
12 Delay unit
13 Edge selector
14 Gate driver
15 Output unit
16 VTC
31 Inverter
32, 33 Power supply circuit
34-1 to 34-$n$ Inverter
35, 36 Inverter
37, 38 Power supply circuit
51-1 to 51-$n$ Inverter
61 Phase detector
62 Low-pass filter
101 Class D amplifier
111 Input unit
112 Integrator
113 Comparator
114 Delay circuit
115 Switch control unit
116 Switch
117 Feedback circuit
118-1, 118-2 Gate driver
119 Output unit
120 Feedback circuit
131 Inverter
132 Power supply circuit
133 Ground circuit
135 Operational amplifier
136 Capacitor
137-1, 137-2 Inverter
138 Power supply circuit
139 Ground circuit
201 Audio player
218 Class D amplifier
301 Noise canceling system
311-1, 311-2 A/D converter
312 Inverter
321-1, 321-2 One-bit $\Delta\Sigma$ A/D converter
351 Noise canceling system
361 DSP
362 One-bit $\Delta\Sigma$ D/A converter
371 Addition unit
381 Resampling unit
382 Phase shift unit
391 Gain setting unit

The invention claimed is:

1. An amplifier, comprising:
   an output unit configured to output a first output pulse width modulation (PWM) signal, wherein
   the first output PWM signal includes error information, and
   the error information corresponds to a voltage error in the first output PWM signal;
   a voltage-to-time converter (VTC) configured to:
   receive the error information from the output unit; and
   integrate the received error information of the first output PWM signal to convert the received error information into error time information;
   an input unit configured to receive an input PWM signal;
   a delay unit configured to generate a plurality of delayed signals based on the input PWM signal; and
   a signal selection unit configured to:
   select a delayed signal from the plurality of delayed signals based on the error time information; and
   output the selected delayed signal.

2. The amplifier according to claim 1, wherein
   the signal selection unit is further configured to adjust a signal width of the first output PWM signal based on the selected delayed signal and the error time information,
   the output unit is further configured to output a second output PWM signal that has the adjusted signal width, and
   the second output PWM signal is output to each of the VTC and an outside of the amplifier.

3. The amplifier according to claim 1, wherein the delay unit includes a plurality of inverters.

4. The amplifier according to claim 1, wherein the delay unit includes a delay locked loop (DLL) circuit.

5. The amplifier according to claim 1, wherein the delay unit includes a phase locked loop (PLL) circuit.

* * * * *